United States Patent
Eguchi

(10) Patent No.: US 10,101,933 B2
(45) Date of Patent: Oct. 16, 2018

(54) CONTROLLER AND MEMORY SYSTEM

(71) Applicant: TOSHIBA MEMORY CORPORATION, Minato-ku, Tokyo (JP)

(72) Inventor: Yasuyuki Eguchi, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/256,485

(22) Filed: Sep. 2, 2016

(65) Prior Publication Data
US 2017/0249097 A1    Aug. 31, 2017

Related U.S. Application Data

(60) Provisional application No. 62/300,697, filed on Feb. 26, 2016.

(51) Int. Cl.
  *G11C 7/00* (2006.01)
  *G06F 3/06* (2006.01)

(52) U.S. Cl.
  CPC ........... *G06F 3/0625* (2013.01); *G06F 3/061* (2013.01); *G06F 3/0659* (2013.01); *G06F 3/0679* (2013.01)

(58) Field of Classification Search
  CPC .......... G11C 7/10; G11C 8/06; G11C 11/4093
  USPC ............. 365/189.17, 230.03, 185.11, 189.18
  See application file for complete search history.

(56) References Cited

U.S. PATENT DOCUMENTS

| 2012/0102344 | A1* | 4/2012 | Kocev | G06F 1/3237 713/322 |
| 2012/0278541 | A1 | 11/2012 | Yamaki | |
| 2016/0188224 | A1* | 6/2016 | Yin | G06F 3/0613 711/154 |
| 2016/0364148 | A1* | 12/2016 | Tan | G06F 3/0604 |
| 2017/0075811 | A1* | 3/2017 | Hsu | G06F 12/0888 |

FOREIGN PATENT DOCUMENTS

| JP | 2003187563 A | 7/2003 |
| JP | 2003323265 A | 11/2003 |

* cited by examiner

*Primary Examiner* — Han Yang
(74) *Attorney, Agent, or Firm* — Holtz, Holtz & Volek PC

(57) ABSTRACT

According to one embodiment, a controller determines a write operation, when a write request to a memory, a write address and data are received, by comparing an amount of use of a write buffer and a threshold for determining a change of a write operation to the memory. The memory is capable of overwriting first data to second data at an identical physical address of the memory. By the determined write operation, the received data is written to the received write address of the memory.

4 Claims, 22 Drawing Sheets

|  | 1 Status | 2 Data copy | 3 Log | 1+2 Status Data copy | 1+3 Status Log | 2+3 Data copy Log | 1+2+3 Status Data copy Log |
|---|---|---|---|---|---|---|---|
| Always | Embodiment 2 |  |  |  |  |  |  |
| A:Buffer |  |  | Embodiment 1 |  |  |  |  |
| B:Data length |  | Embodiment 3 |  |  |  |  |  |
| C:New W mode | Embodiment 4 |  |  |  |  |  |  |
| A+B Buffer Data length |  |  |  |  |  |  |  |
| A+C Buffer New W mode |  |  |  |  |  |  |  |
| B+C Data length New W mode |  |  |  |  |  |  |  |
| A+B+C Buffer Data length New W mode |  |  |  |  |  |  |  |

FIG. 1

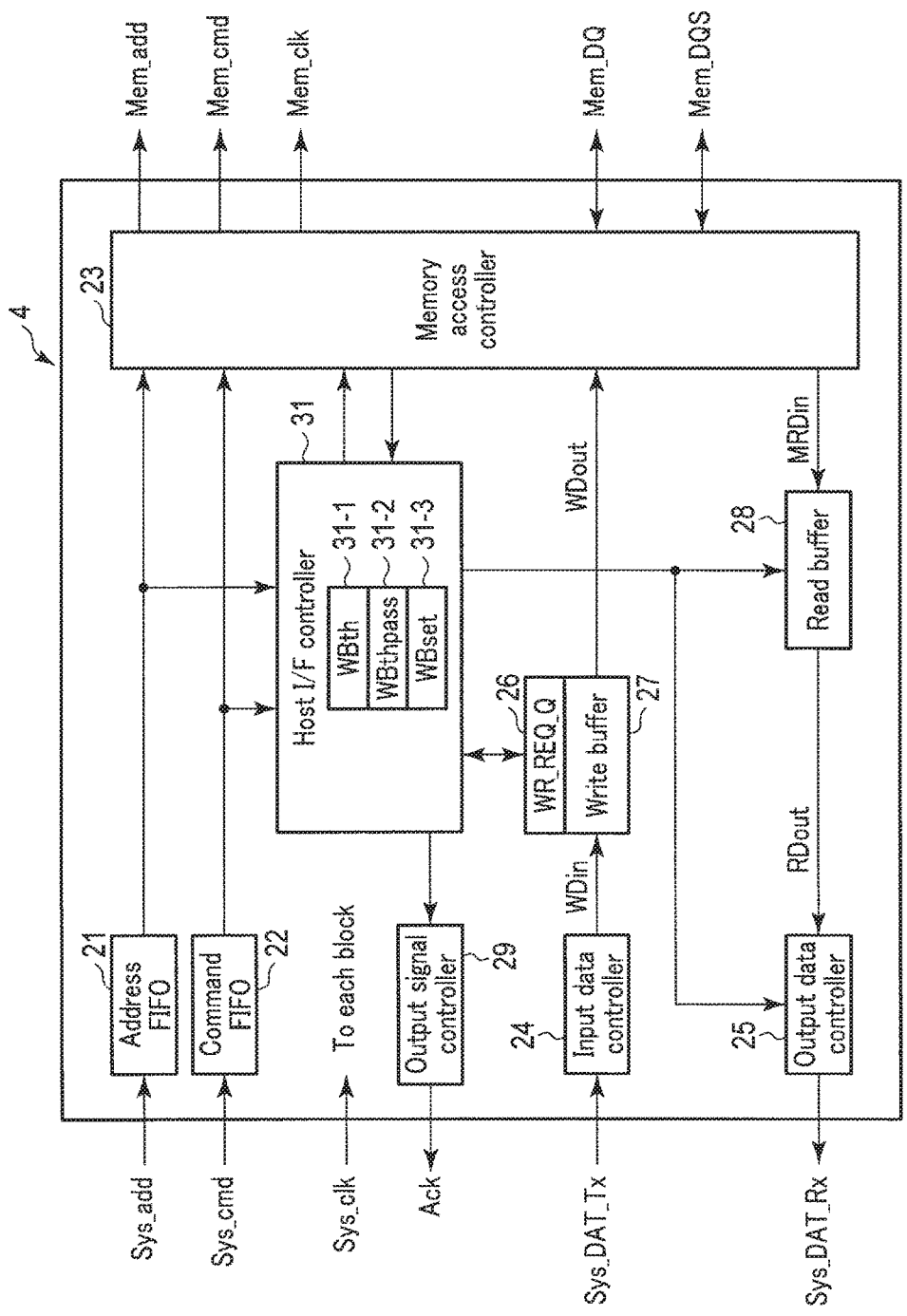
F I G. 4

~ 31-3

| WBset[n] | |
|---|---|
| 7 | 1MB (all area) |
| 6 | 256KB |
| 5 | 64KB |
| 4 | 16KB |
| 3 | 4KB |
| 2 | 1KB |
| 1 | 256B |
| 0 | 64B |

F I G. 8

~ 31-2

| WBthpass[n] | |
|---|---|
| 7 | 0 |
| 6 | 0 |
| 5 | 1 |
| 4 | 1 |
| 3 | 1 |
| 2 | 1 |
| 1 | 1 |
| 0 | 1 |

F I G. 9

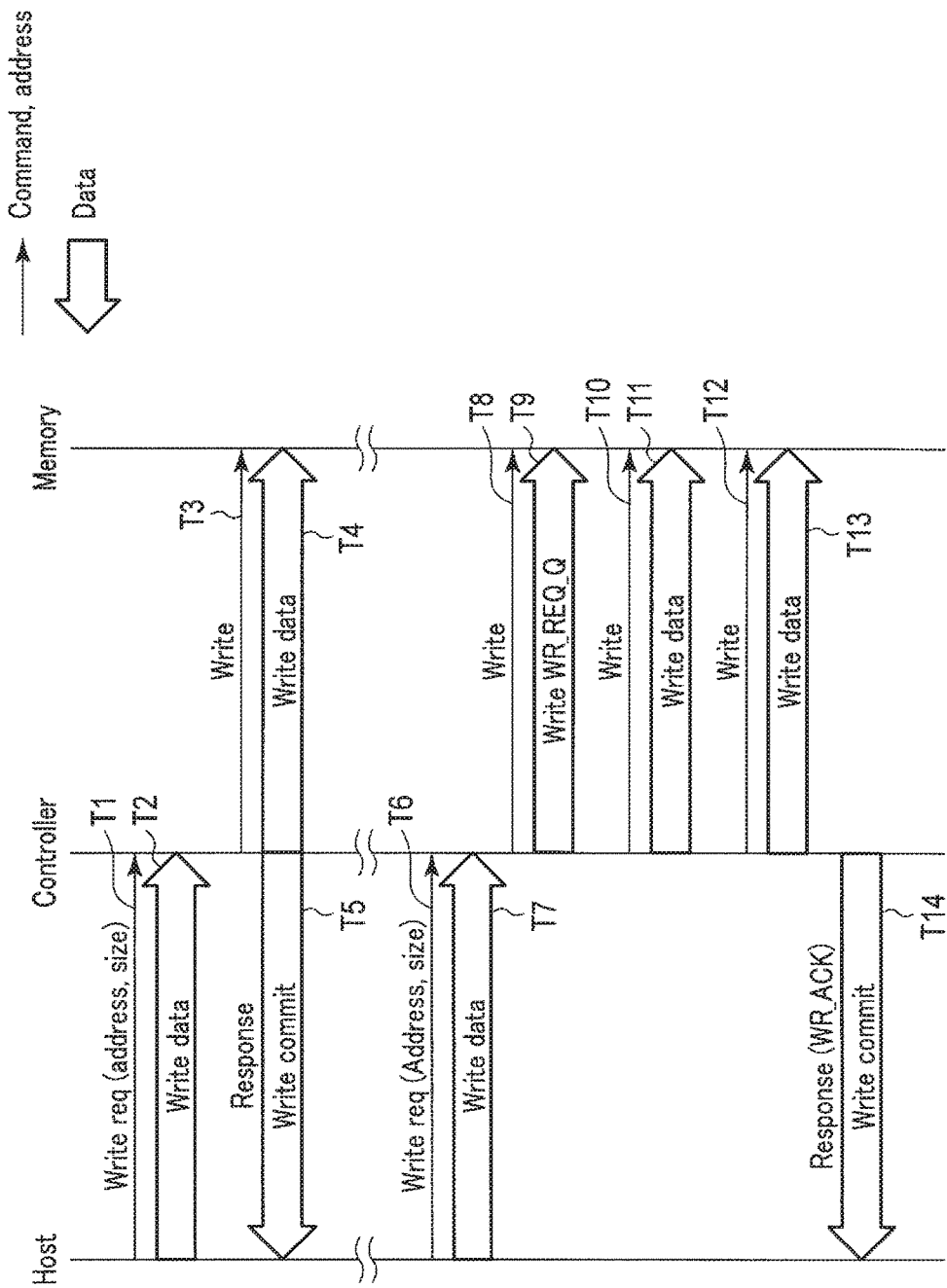
F I G. 10

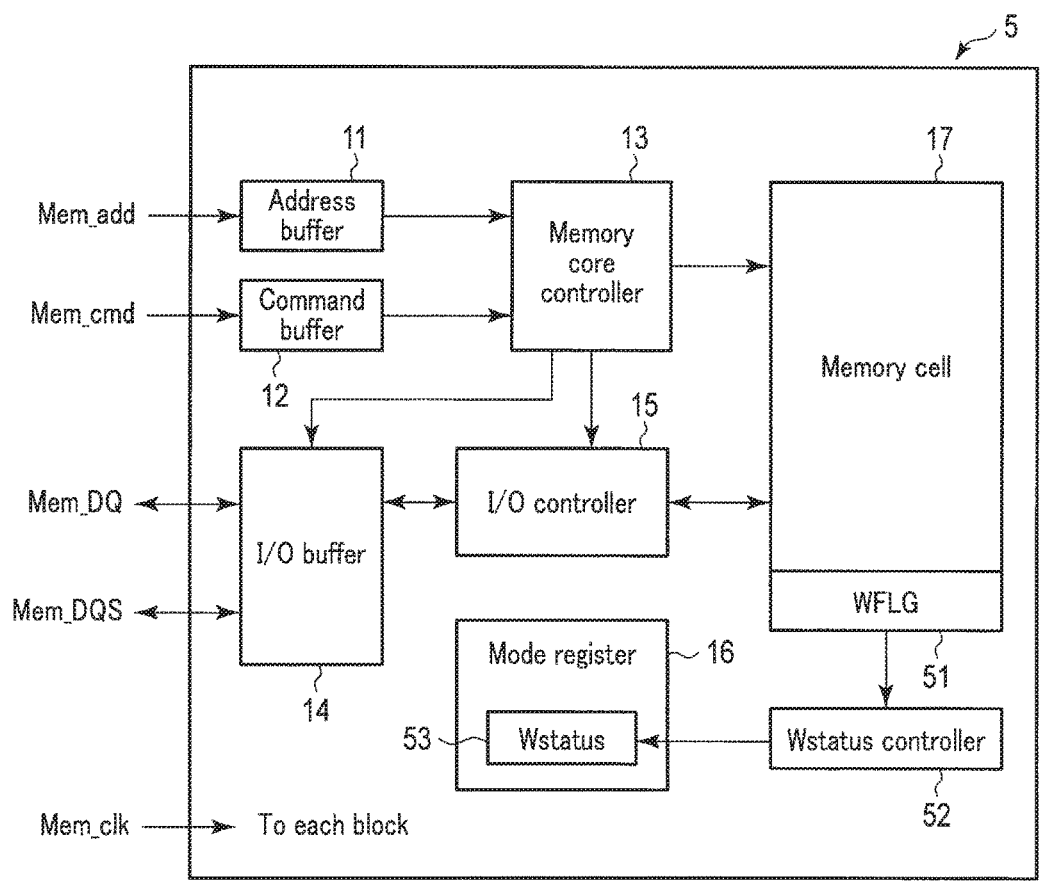
F I G. 11

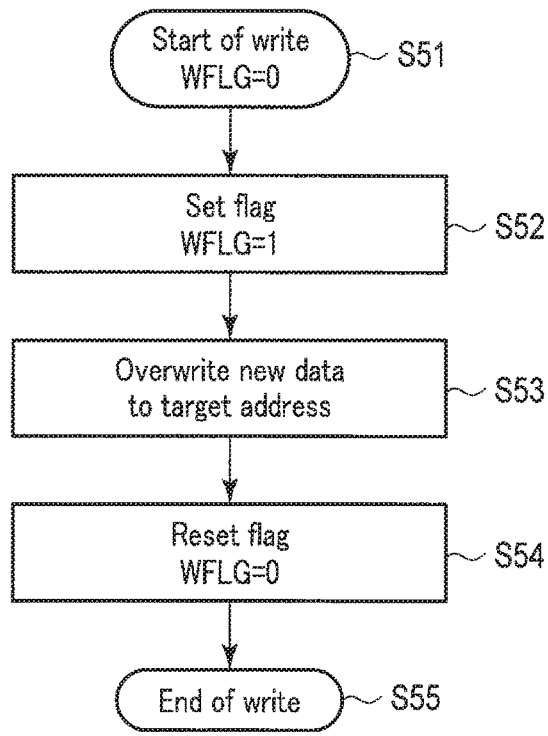
F I G. 12
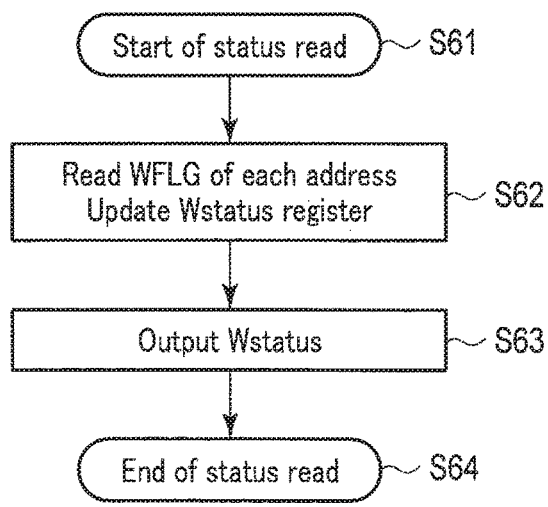
F I G. 13

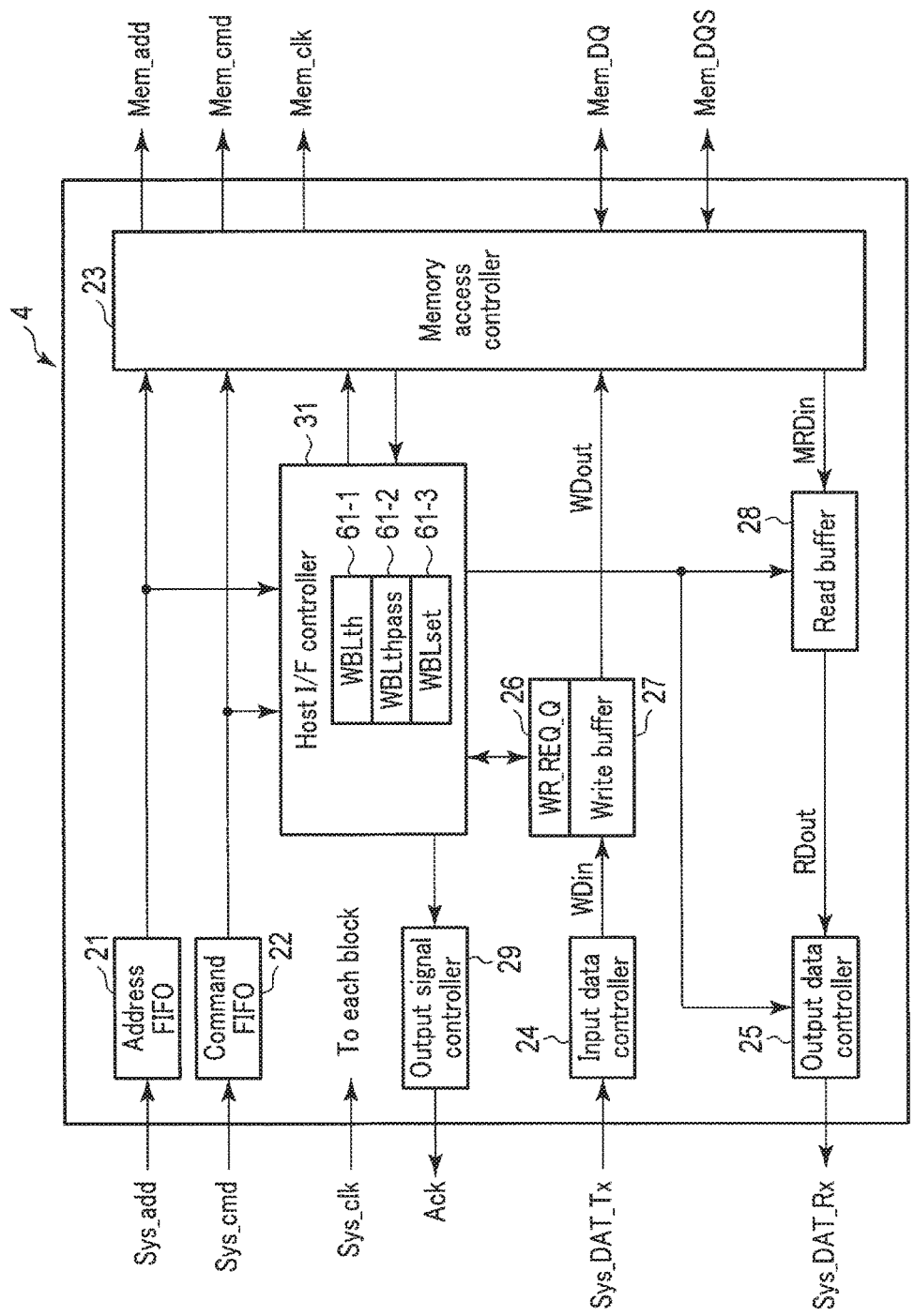
F I G. 15

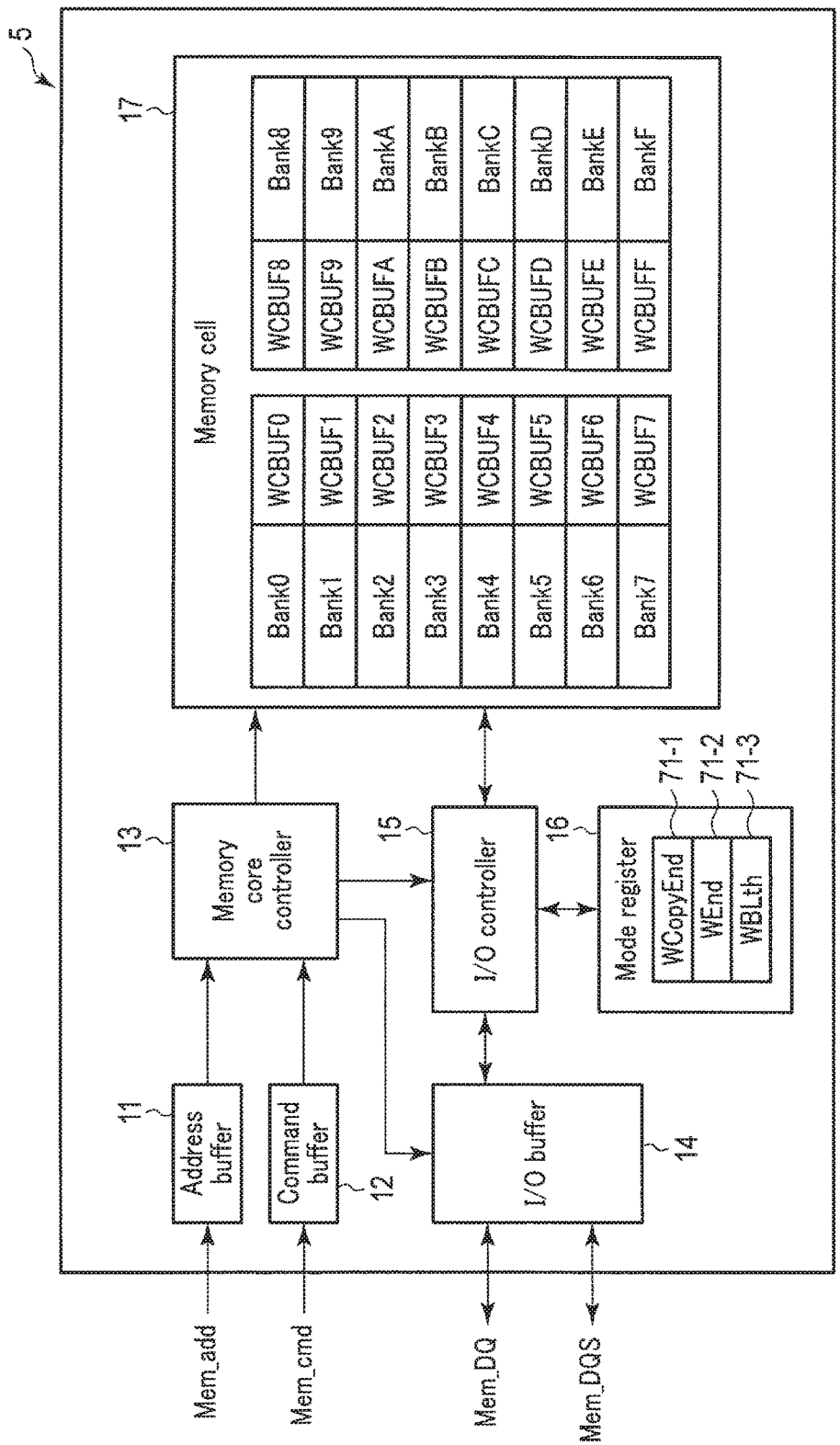
F I G. 16

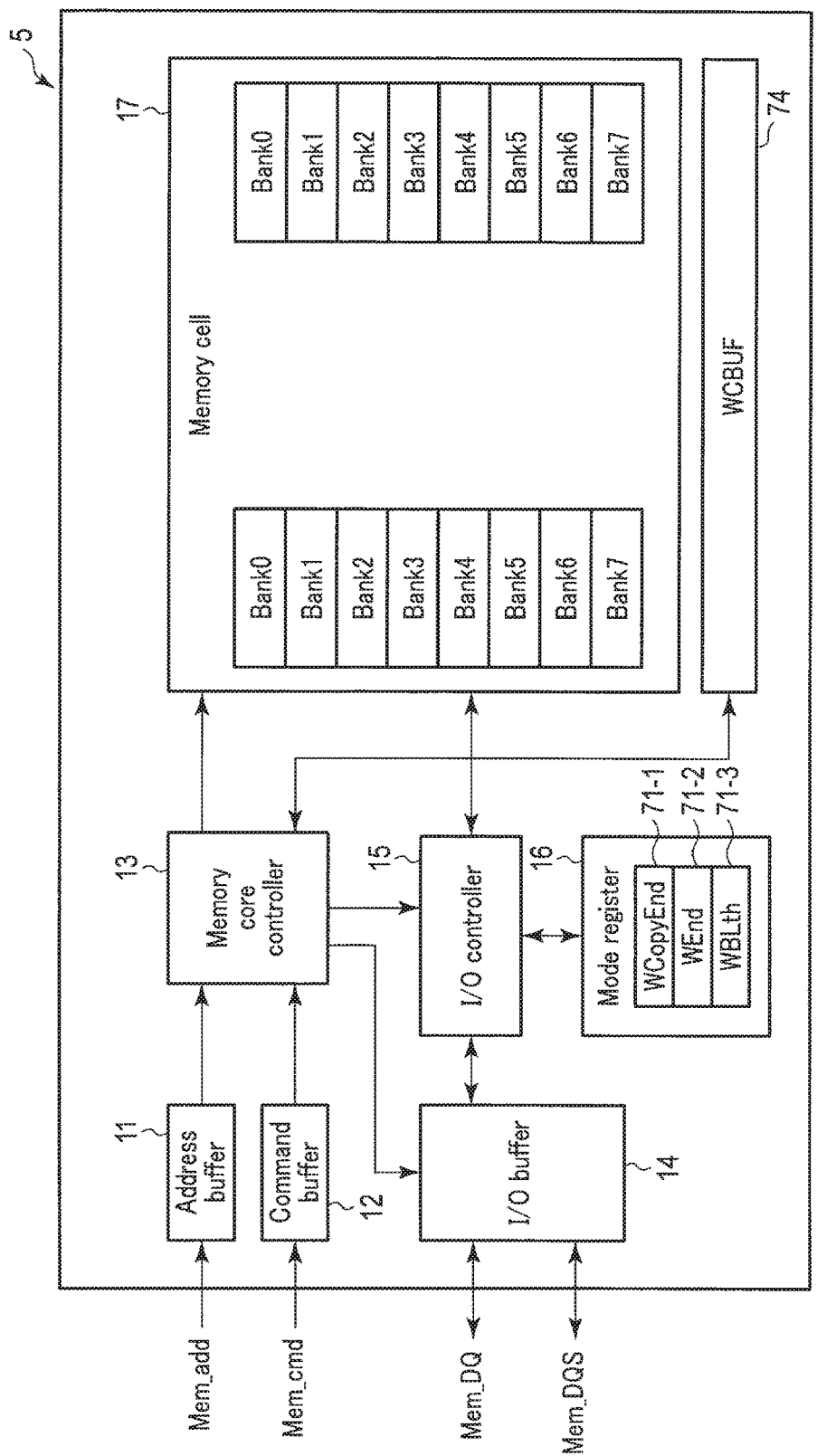
F I G. 17

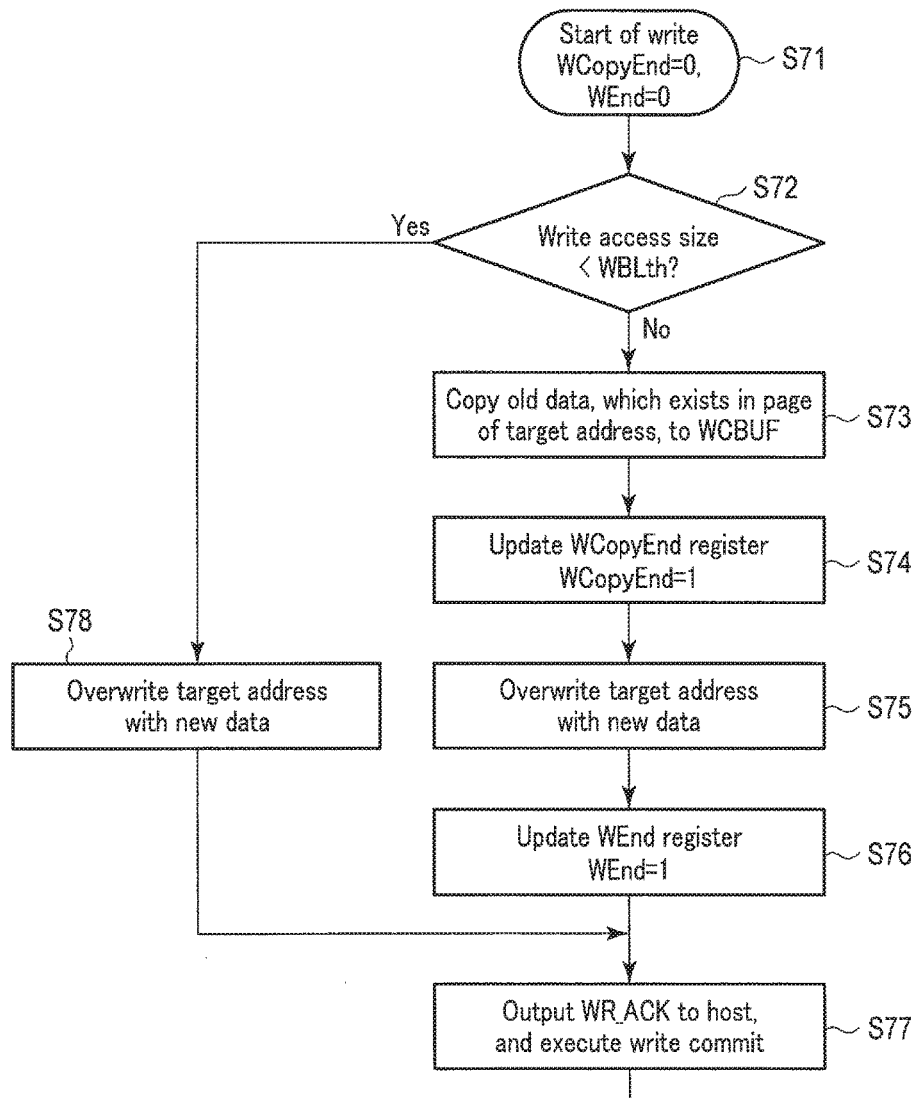

61-3

| WBLset[n] | |
|---|---|
| 7 | 1MB |
| 6 | 256KB |
| 5 | 64KB |
| 4 | 16KB |
| 3 | 4KB |
| 2 | 1KB |
| 1 | 256B |
| 0 | 64B |

F I G. 22

61-2

| WBLthpass[n] | |
|---|---|
| 7 | 0 |
| 6 | 0 |
| 5 | 1 |
| 4 | 1 |
| 3 | 1 |
| 2 | 1 |
| 1 | 1 |
| 0 | 1 |

F I G. 23

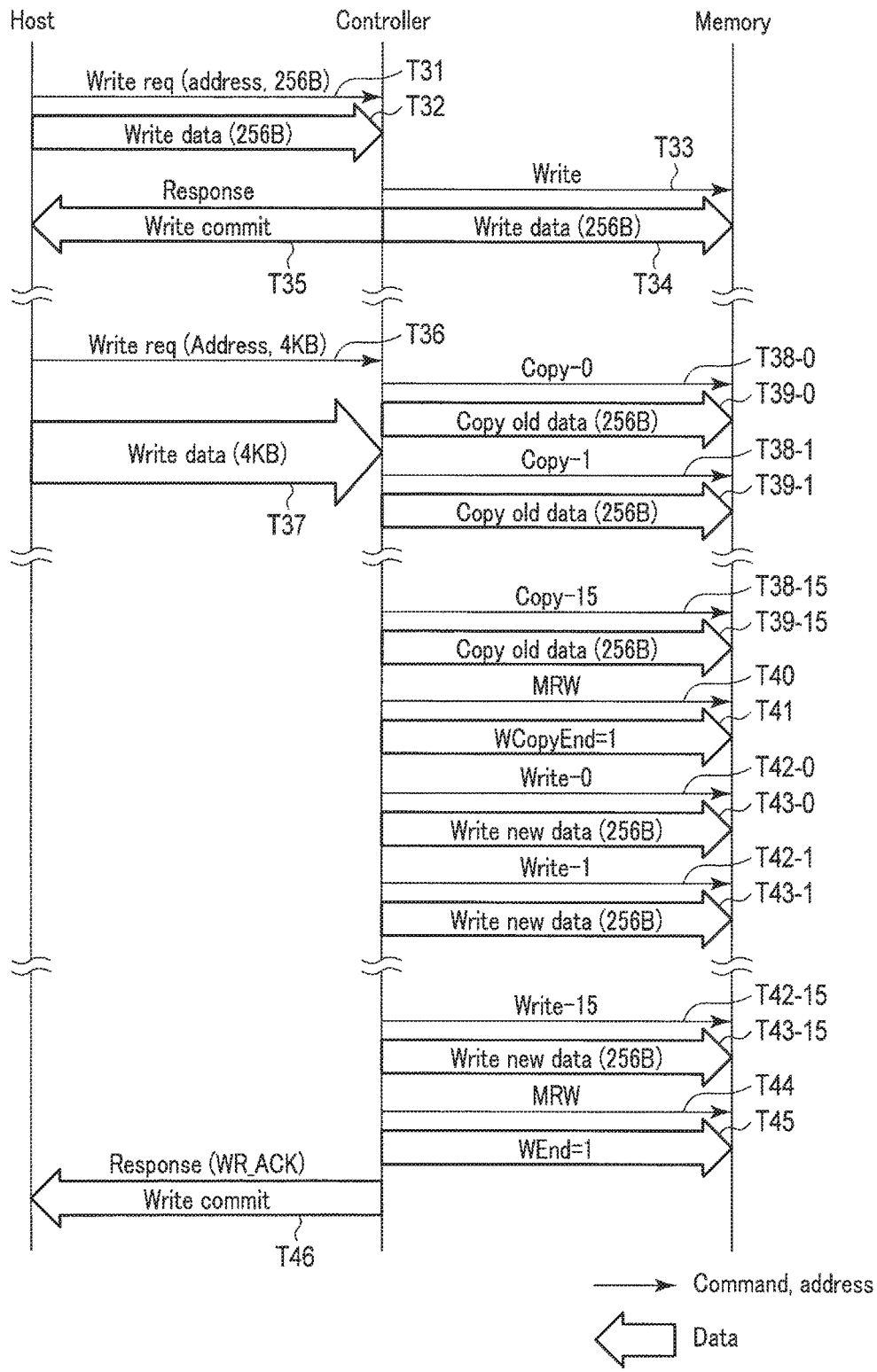
F I G. 24

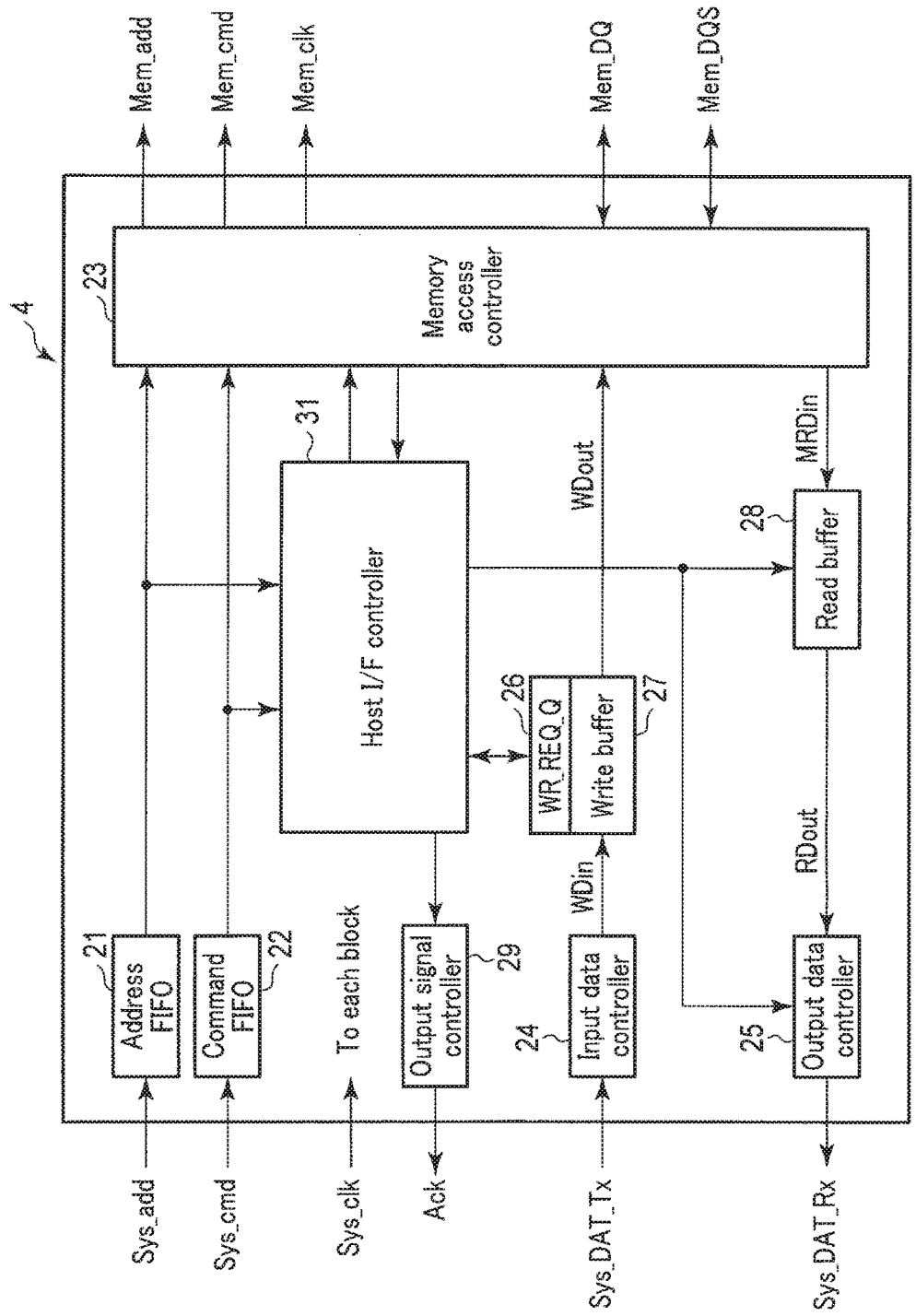
F I G. 25

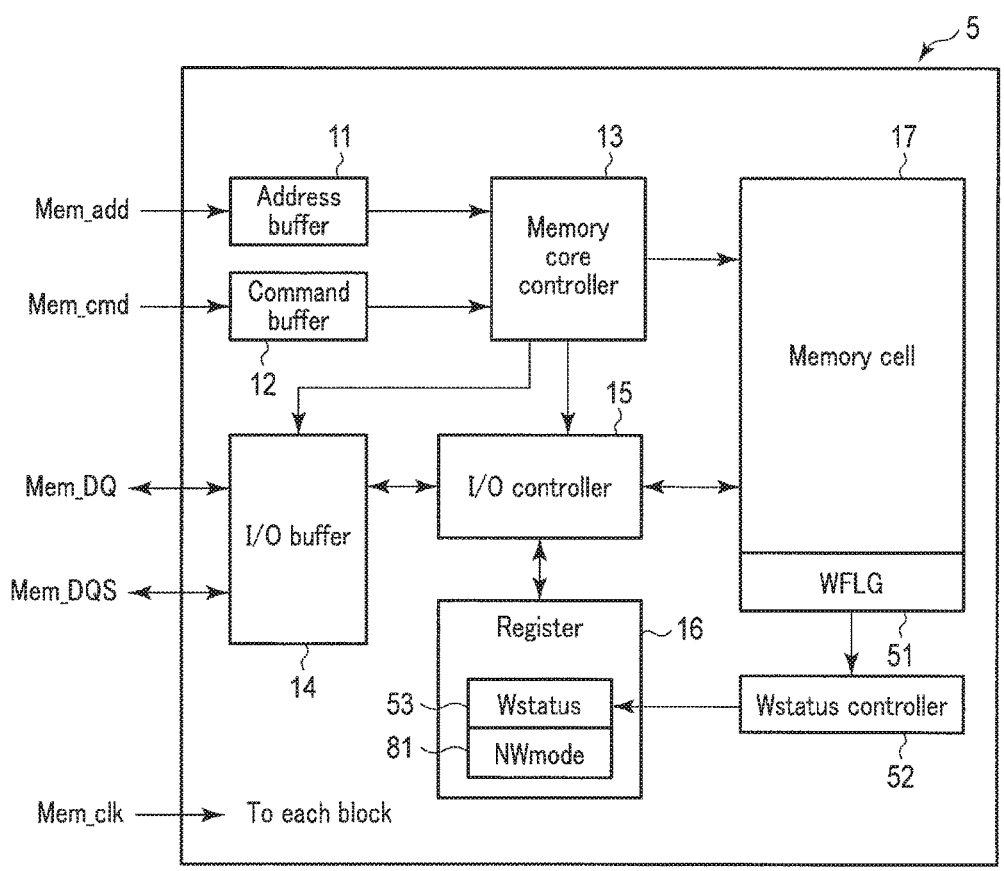
F I G. 26

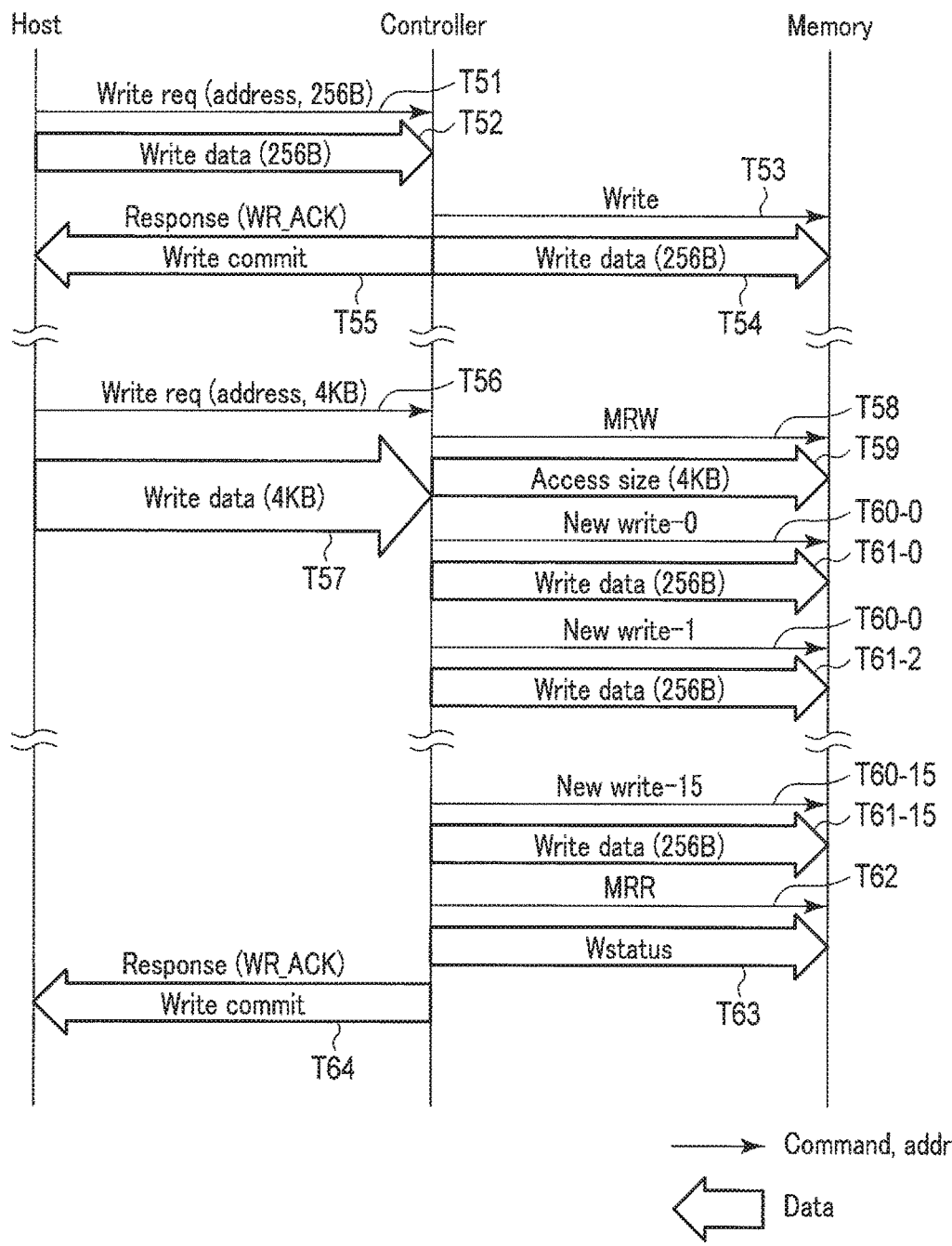
F I G. 29

CONTROLLER AND MEMORY SYSTEM

CROSS-REFERENCE TO RELATED APPLICATIONS

This application claims the benefit of U.S. Provisional Application No. 62/300,697, filed Feb. 26, 2016, the entire contents of which are incorporated herein by reference.

FIELD

Embodiments described herein relate generally to a controller and a memory system.

BACKGROUND

Volatile memories, such as a random access memory (RAM), and nonvolatile memories, such as a magnetoresistive random access memory (MRAM), are widely used. In general, these memories are required to have reliability.

BRIEF DESCRIPTION OF THE DRAWING

FIG. 1 is a view illustrating modes of use of embodiments.

FIG. 4 is a view illustrating functional blocks of the memory controller 4 of the first embodiment.

FIG. 8 is a view illustrating a register 31-3 which retains a training condition (WBset) which designates a threshold for use in the training of the write buffer 27.

FIG. 9 is a view illustrating a register 31-2 which stores a result (WBLthpass) of the training of the write buffer 27.

FIG. 10 is a view illustrating a time chart of a host CPU 1, memory controller 4 and memory 5 of the first embodiment.

FIG. 11 is a view illustrating functional blocks of a memory 5 of the second embodiment.

FIG. 12 is a flowchart of a write operation of the memory 7 of the second embodiment.

FIG. 13 is a flowchart of status read of the memory 7 of the second embodiment.

FIG. 15 is a view illustrating functional blocks of a memory controller 4 of the third embodiment.

FIG. 16 is a view illustrating functional blocks of a memory 5 of the third embodiment.

FIG. 17 is a view illustrating an example in which a write copy buffer (WCBUF) 74, which is common to each bank, is provided.

FIG. 18 is a view illustrating a truth value table of a value (WCopyEnd) of a register 71-1 and a value (WEnd) of a register 71-2.

FIG. 19 is a flowchart (copy of old data) at a time of write of the memory controller 4 of the third embodiment.

FIG. 22 is a view illustrating a register 61-3 which designates a write burst length (WBLset) which is used in the training of write data length.

FIG. 23 is a view illustrating a register 61-2 which stores a result (WBLthpass) of the training of the write burst length.

FIG. 24 is a time chart of a host CPU 1, memory controller 4 and memory 5 of the third embodiment.

FIG. 25 is a view illustrating functional blocks of a memory controller 4 of the fourth embodiment.

FIG. 26 is a view illustrating functional blocks of a memory 5 of the fourth embodiment.

FIG. 29 is a time chart of a host CPU 1, memory controller 4 and memory 5 of the fourth embodiment.

DETAILED DESCRIPTION

Figure 2:
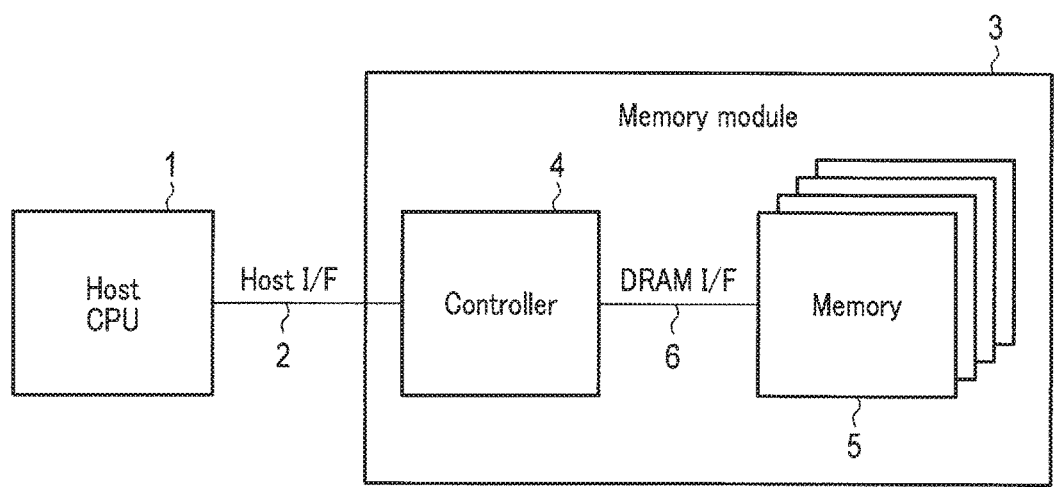
FIG. 2 is a view illustrating a memory module 3 incorporating a memory controller 4 and a memory 5, to which a first embodiment, a third embodiment and a fourth embodiment are applied.

According to one embodiment, a controller determines a write operation, when a write request to a memory, a write address and data are received, by comparing an amount of use of a write buffer and a threshold for determining a change of a write operation to the memory. The memory is capable of overwriting first data to second data at an identical physical address of the memory. By the determined write operation, the received data is written to the received write address of the memory.

1. Outline of Embodiments

In a NAND flash memory, overwrite cannot be executed. Thus, if a memory controller, which controls the NAND flash memory, receives a request for overwrite of data of a certain logical address, the memory controller indirectly executes the overwrite request by the following process. Specifically, the memory controller writes new data at a location (physical address) which is different from the location of old data, and updates a correspondency relationship between a logical address and a physical address at which new data was written.

In this case, even when new data failed to be written due to power interruption, since old data exists, the old data can be restored after power is restored.

Although the object of the embodiments is an overwritable memory such as an MRAM, the atomicity can be ensured by the method of the above-described flash memory. In this case, however, the management and update of the logical address and physical address become necessary, and it is possible that the read or write time greatly increases. For example, when data is read, a conversion table of the logical address and physical address is read, and then data is read. Thus, about double or more read time is needed. The same applies to the time of write. In addition, a data storage area and an area for storing an additional table are needed.

In the meantime, in the overwritable memory such as an MRAM, first data, which is written at a certain physical address, can be overwritten to second data. Such overwrite is different from the above-described overwrite to a certain logical address. Specifically, in the overwritable memory, write of second data to a physical address, at which first data is written, can be directly executed to this physical address. The term "overwrite" used in this specification refers to this direct write of other data to the physical address at which data is already written.

On the other hand, in a purpose of use such as a database, when old data is updated to new data, it is necessary that even in case of power interruption, the old data be left as such, or the old data be rewritten to the new data. The data must not be destroyed (e.g. only half data is updated to new data). Furthermore, in the case of a memory module including a volatile write cache, there is such a case in which successive write requests occur, and data that is yet to be written remains in the write buffer of the controller. In this state, there may be a case in which when power interruption occurred, there is data that cannot be written. It is thus necessary to control the acceptance of write data.

In the present embodiment, new write operations are introduced. Thereby, when power interruption occurred, control is executed to ensure that there is no data that cannot be written when power interruption occurred. The new write operations include operation 1, operation 2 and operation 3. Situations in which the new write operations are used are "always", case A, case B, and case C. In the present embodiments, combinations of them are thinkable. FIG. 1 is a view illustrating modes of use of the embodiments. In this embodiments, the meaning of "power interruption" includes the case where a power supply to a controller 4 or a memory module 7 is interrupted.

New write operations
  Operation 1: status
    Status information indicating whether write was completed or not is stored in a register, the write completion is confirmed by read of the register, and a transition occurs to the next operation.
  Operation 2: copy
    A copy of old data is created, and thereafter data destruction by overwrite is prevented.
    New data is made nonvolatile, and then overwrite may be executed.
  Operation 3: log
    Information, such as an address of an access target and a data length, is made nonvolatile, and thereby the presence of data, which cannot be written in case of power interruption, can be confirmed.
    In addition, the address range of data, which cannot be written, can be confirmed.
  Situations in which new write operations are used
    Always
    Case A: a case in which the amount of use of a write buffer of a controller has exceeded a threshold (WBth).
    Case B: a case in which a data access length has exceeded the threshold (WBth).
    Case C: a case in which a new write mode is explicitly indicated from a user side.
    For example, an entry is made to a new write operation mode in a mode register.
  In addition, in case A and case B, a scheme of training for searching thresholds (WBth, WBLth) is necessary.

Figure 3:
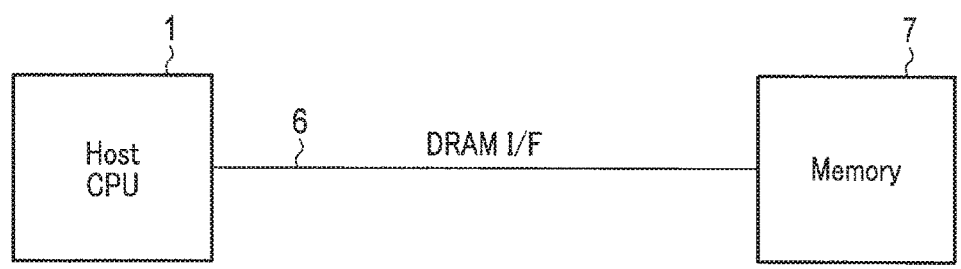
FIG. 3 is a view illustrating a memory module 7 which does not incorporate a memory controller, a second embodiment being applied to the memory module 7.

FIG. 2 is a view illustrating a memory module 3 incorporating a memory controller 4 and a memory 5, to which a first embodiment, a third embodiment and a fourth embodiment are applied. FIG. 3 is a view illustrating a memory module 7 which does not incorporate a memory controller, a second embodiment being applied to the memory module 7.

As illustrated in FIG. 2, a host CPU 1 is connected to the memory module 3 via a host I/F 2. The host I/F 2 is, for instance, SATA (Serial ATA), eMMC (Embedded Multi-Media Card), UFS (Universal Flash Storage), or HMC (Hybrid Memory Cube).

The memory module 3 includes a memory controller 4 which is connected to the host I/F 2, and a memory 5 which is connected via a DRAM I/F 6. In the configuration of FIG. 2, upon receiving a command from the host CPU 1, the memory controller 4 executes a predetermined process in the memory module 3.

In the second embodiment, a description is given of a memory 5 illustrated in FIG. 3, which does not incorporate a memory controller.

As illustrated in the Figure, a host CPU 1 is connected to a memory module 7 via a DRAM I/F 6. In the configuration of FIG. 3, the host CPU 1 executes a predetermined process, and outputs a memory command to the memory module 7. Upon receiving the memory command, the memory module 7 executes a predetermined process.

In the meantime, the function, which is executed in the host CPU 1, may be executed in the memory module 3, 7. In addition, the function, which is executed in the memory module 3, 7, may be executed in the host CPU 1.

Hereinafter, the embodiments will be described with reference to the accompanying drawings. In the description below, structural elements having substantially identical functions and configurations are denoted by like reference numerals, and an overlapping description is given only where necessary. The drawings are schematic ones. All descriptions relating to a certain embodiment applies to other embodiments, unless excluded explicitly or self-evidently.

Functional blocks illustrated in the drawings can be realized by hardware, or computer software, or the combination thereof. Thus, the functional blocks will be described mainly from the viewpoint of their functions, so as to make it clear that each functional block is hardware, or computer software, or the combination thereof. In addition, it is not imperative that the respective functional blocks are distinguished as illustrated. For example, some function may be realized by a functional block which is different from the illustrated functional block. Moreover, an illustrated functional block may be further divided into more specific functional sub-blocks. The embodiments are not restricted by which functional blocks specify the embodiments. Furthermore, the order of steps of flows illustrated in the drawings can be changed, unless negated explicitly or self-evidently.

2. First Embodiment

A first embodiment relates to a situation of use of a new write operation, in which when the amount of use of the write buffer of the controller in case A has exceeded a threshold (WBth), the log of operation 3 is used as the new write operation.

Figure 5:
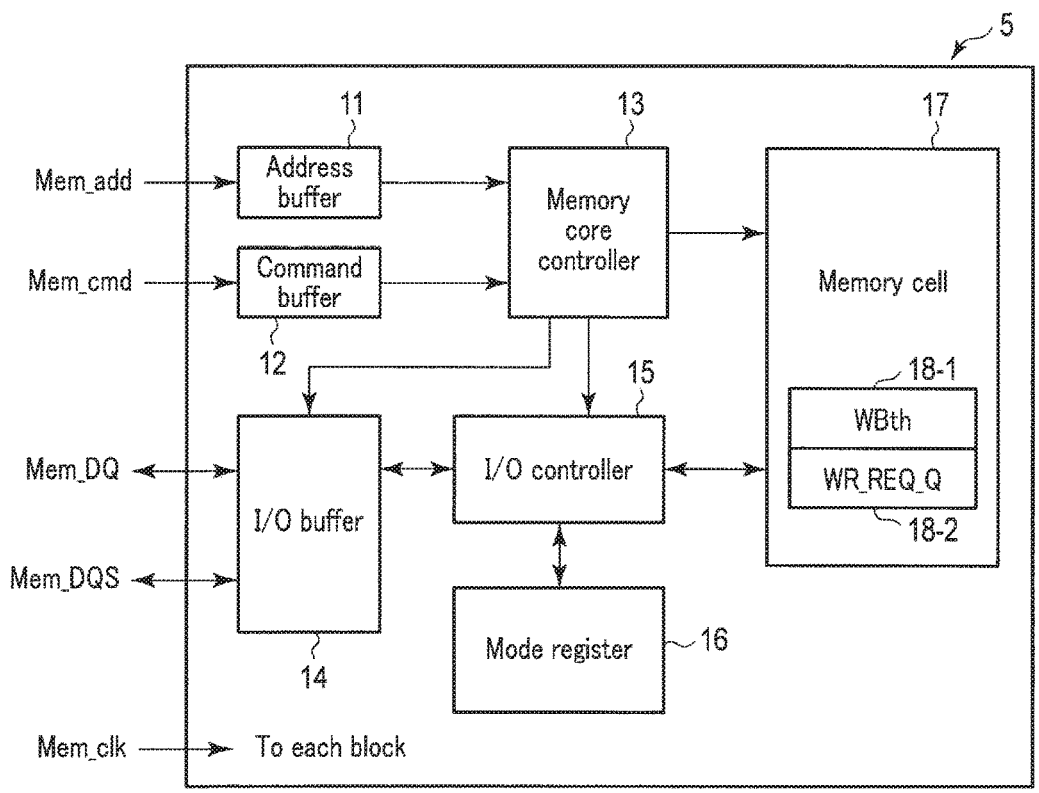
FIG. 5 is a view illustrating functional blocks of the memory 5 of the first embodiment.

FIG. 4 is a view illustrating functional blocks of the first embodiment. The controller memory controller 4 of the first embodiment. The controller 4 controls a memory 5 illustrated in FIG. 5. FIG. 5 is a view illustrating functional blocks of the memory 5 of the first embodiment. Prior to the description of the memory controller 4, the memory of FIG. 5 is described.

The memory 5 is, for instance, a dynamic RAM (DRAM), a magnetoresistive RAM (MRAM), a resistive RAM (ReRAM), or a phase change RAM (PCRAM). Although the present embodiment is not restricted by the method of storage of data of the memory 5, the embodiment is particularly suitable for a nonvolatile memory such as an MRAM. The memory 5 includes an address buffer 11, a command buffer 12, a memory core controller 13, an I/O buffer 14, an I/O controller 15, a mode register 16, and a memory cell 17.

The address buffer 11 temporarily stores an address Mem_add from the memory controller 4, and supplies this to the memory core controller 13. The command buffer 12 temporarily stores a command Mem_cmd from the memory controller 4, and supplies this to the memory core controller 13. The I/O buffer 14 strobes, by a signal Mem_DQS, write data which is sent from the memory controller 4 via data Mem_DQ, and supplies the write data to the I/O controller 15. In addition, the I/O buffer 14 sends read data from the I/O controller 15 via the data Mem_DQ, and sends a signal for strobe Mem_DQS to the controller 4. By the control of the memory core controller 13, the I/O buffer 14 supplies write data to the I/O controller 15 and receives read data from the I/O controller 15. In accordance with the control of the memory core controller 13, the I/O controller 15 supplies the write data to the memory cell 17, and receives read data from the memory cell 17. Based on the address and control signal from the address buffer 11 and command buffer 12, the memory core controller 13 writes data to the memory cell 17, and reads data from the memory cell 17. The memory cell 17 includes a plurality of memory cells, and elements such as various signal lines. The mode register 16 stores various pieces of information. A clock signal Mem_clk from the memory controller 4 is supplied to each of the blocks.

The memory 5 stores a threshold (WBth) 18-1 of a write buffer 27 and a log (WR_REQ_Q) 18-2 of a write queue in a part of the memory cell 17, or in an area different from the memory cell 17. The threshold (WBth) 18-1 of the write buffer 27 is stored in the memory 5 and made nonvolatile, after training (to be described) is executed. At a time of activation, the memory controller 4 reads the value of the threshold (WBth) 18-1 of the write buffer 27 from the memory 5, and stores the value in a register 31-1 of the host I/F controller 31.

Reference is made back to FIG. 4. The memory controller 4 includes an address FIFO 21, a command FIFO 22, a memory access controller 23, an input data controller 24, and an output data controller 25. The address FIFO 21 temporarily stores an address Sys_add from the host CPU 1, and supplies this to the memory access controller 23. The command FIFO 22 temporarily stores a command Sys_cmd from the host CPU 1, and supplies this to the memory access controller 23. The input data controller 24 temporarily stores input data Sys_DAT_Tx from the host CPU 1, and outputs write data WDin, based on the data Sys_DAT_Tx. The output data controller 25 temporarily stores read data RDout, and outputs read data Sys_DAT_Rx, based on an instruction from the host I/F controller 31.

The memory access controller 23 generates, based on the command Sys_cmd, an address Mem_add and a command Mem_cmd for executing data write to the address Sys_add and data read from the Sys_add. In addition, the memory access controller 23 receives data Mem_DQ and Mem_DQS from the memory 5, and outputs read data MRDin, based on the data Mem_DQ and Mem_DQS. Further, the memory access controller 23 receives write data MWDout, and generates data Mem_DQ and Mem_DQS which are written to the memory 5, from the write data MWDout.

A log (WR_REQ_Q) 26 of a write queue stores a write queue (operation log) including a write request (write command), a write address and a write data size.

The write buffer 27 temporarily stores write data WDin which was output from the input data controller 24, and outputs write data NWDout to the memory access controller 23.

The read buffer 28 stores read data MRDin from the memory access controller 23, and outputs it as RDout to the output data controller 25.

The output signal controller 29 outputs an output signal to the host CPU 1 based on an instruction from the host I/F controller 31. The output signal includes a response (Ack) representing a commit of a write operation in the embodiments.

The host I/F controller 31 monitors the amount of write data WDin which is stored in the write buffer 27. When the amount of use of the write buffer 27 has exceeded the threshold (WBth), the host I/F controller 31 writes the write queue log (WR_REQ_Q) 26 in the memory cell 17. In addition, the host I/F controller 31 includes registers 31-1~31-3.

The register 31-1 stores the threshold (WBth) of the write buffer 27.

The register 31-2 stores a training result (WBthpass) in the training for checking the threshold (WBth) of the write buffer 27.

The register 31-3 retains the training condition (WBset) in the training for checking the threshold (WBth) of the write buffer 27.

In addition, the host I/F controller 31 controls the memory access controller 23, thereby controlling the timing of write to the memory cell 17 and the timing of read from the memory cell 17. Further, based on a predetermined condition, the host I/F controller 31 writes a write queue in the write queue log (WR_REQ_Q) 26.

Figure 6:
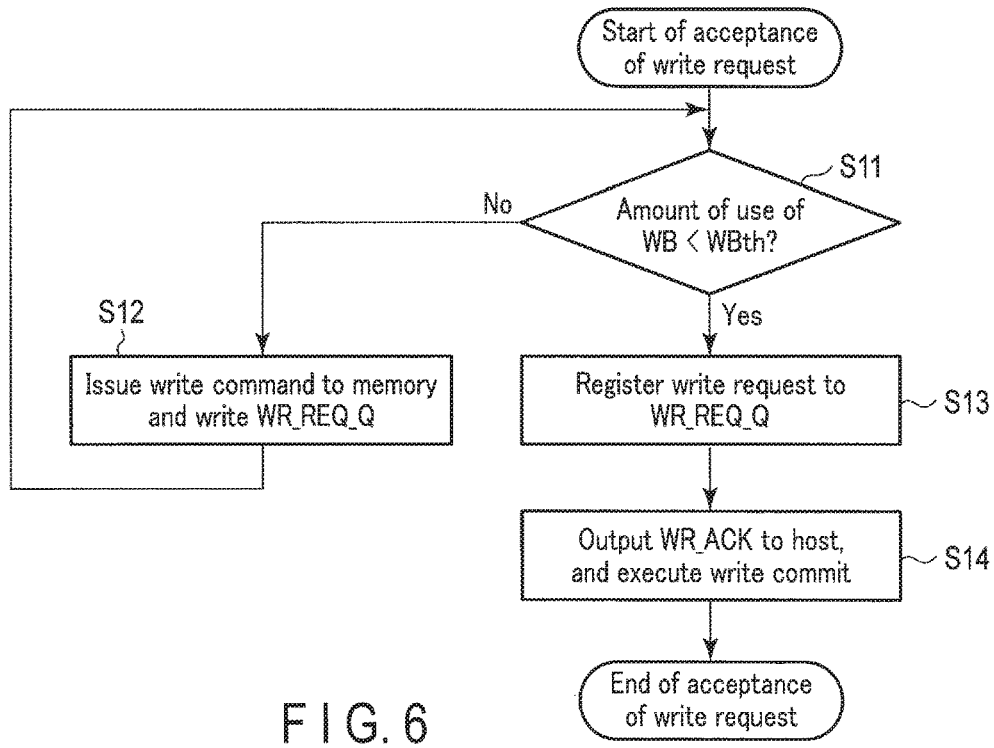
FIG. 6 is a flowchart illustrating a case in which a host I/F controller 31 of the memory controller 4 has accepted a write request.

FIG. 6 is a flowchart illustrating a case in which the host I/F controller 31 of the memory controller 4 has accepted a write request.

Upon accepting the write request from the host CPU 1, it is determined whether the amount of use of the write buffer 27 is less than the threshold (WBth) of the write buffer 27 (S11). In S11, if it is determined that the amount of use of the write buffer 27 is equal to or more than the threshold (WBth) of the write buffer 27, the host I/F controller 31 controls the memory access controller 23, issues a write command to the memory cell 17, and writes a write queue log (WR_REQ_Q) 26 to the memory cell 17 (S12; write queue log (WR_REQ_Q) 18-2 in FIG. 5).

On the other hand, in S11, if it is determined that the amount of use of the write buffer 27 is less than the threshold (WBth) of the write buffer 27, the host I/F controller 31 stores a write queue (operation log), which includes a write request, a write address and write data, in the write queue log (WR_REQ_Q) 26 of the host I/F controller 31 (S13).

Thereafter, the host I/F controller 31 outputs a response (WR_ACK) to the host CPU 1, and commits write of the write data (S14). Thereby, the acceptance of the write request is completed.

Figure 7:
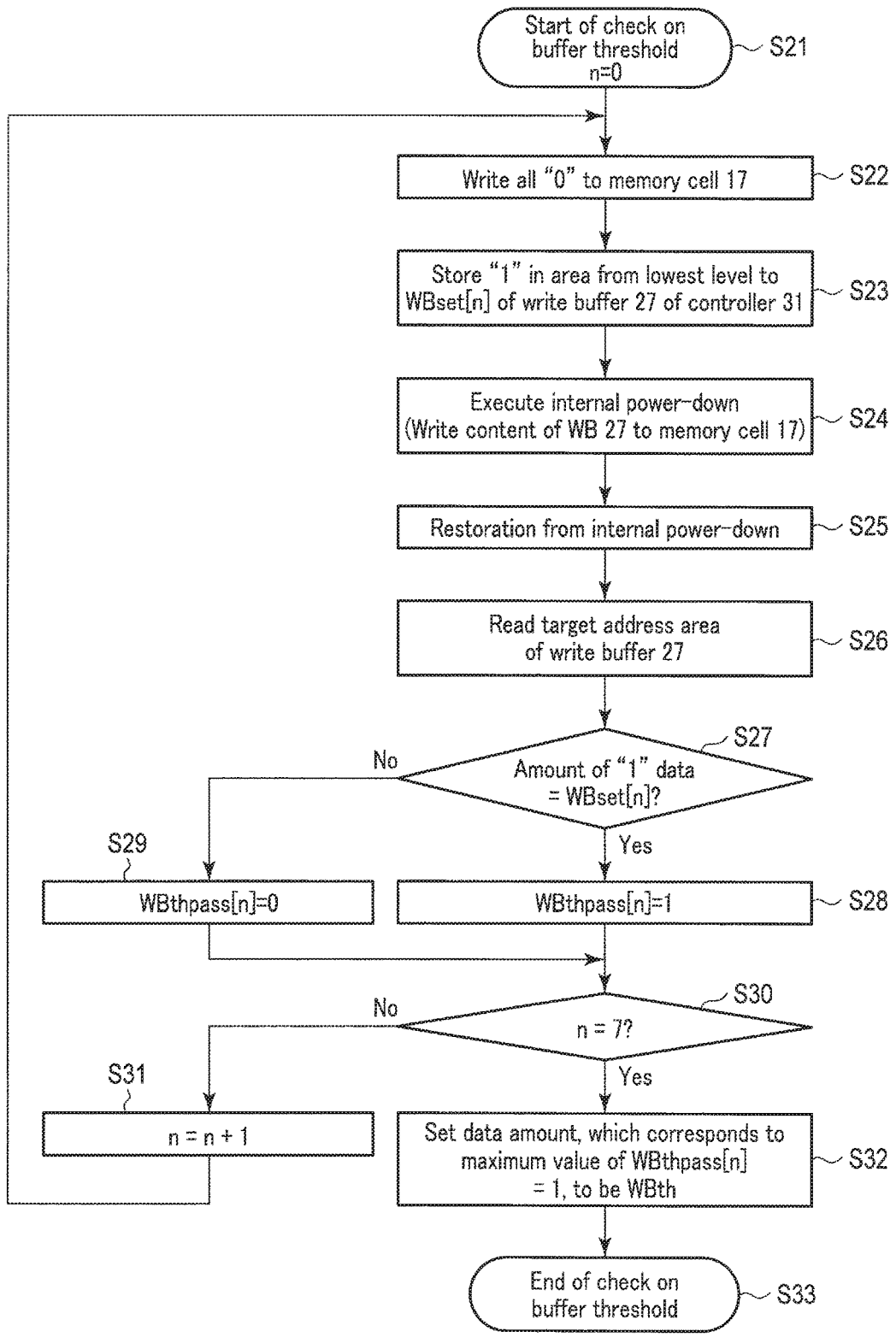
FIG. 7 is a flowchart illustrating training which determines a threshold (WBth) of a write buffer 27 of the first embodiment.

FIG. 7 is a flowchart illustrating training which determines the threshold (WBth) of the write buffer 27 of the first embodiment. FIG. 8 is a view illustrating the register 31-3 which retains a training condition (WBset) which designates the threshold of the write buffer for use in the training of the write buffer 27. In the present embodiment, the capacity of the write buffer 27 is set at 1 MB, and the training is executed with 8-step thresholds of the write buffer 27 illustrated in FIG. 8.

As illustrated in FIG. 8, the training is executed with eight thresholds, namely WBset[0]=64 B, WBset[1]=256 B, WBset[2]=1 KB, WBset[3]=4 KB, WBset[4]=16 KB, WBset[5]=64 KB, WBset[6]=256 KB, WBset[7]=1 MB (All area).

FIG. 9 is a view illustrating the register 31-2 which stores a result (WBthpass) of the training of the write buffer 27. In the present embodiment, results (WBthpass[n]), which are associated with the 8-step training (WBset[n]) stipulated in the register 31-3, are stored in the register 31-2. For example, in the case of n=0, the training is executed with respect to the threshold of the write buffer 27 of WBset[0]= 64 B, and the result thereof is stored in the WBthpass[0]. In the present embodiment, "0" is "Fail", and "1" is "Pass". For example, when a training result as illustrated in FIG. 9 was obtained, the greatest value of the WBthpass=1 (Pass) is n=5. Specifically, WBth=WBset[5]=64 KB is selected as the threshold (WBth) of the write buffer 27. In addition, even when the result as illustrated in FIG. 9 was obtained as described above, a slightly lower threshold of the write buffer 27, for example, WBth=WBset[4]=16 KB, may be set, taking it into account that the amount of the write buffer 27, which is transferable at a time of power interruption, decreases due to degradation of capacitors, etc. The timing and condition for executing the training are arbitrary. For example, the training may be executed at each time of activation, or at regular time intervals.

Reference is made back to FIG. 7. A check on the threshold (WBth) of the write buffer 27 is started (S21, n=0).

In all areas of the memory cell 17, "0" is written (S22).

In the areas from the lowest level to WBset[n] of the write buffer 27 of the host I/F controller 31, "1" is stored (S23). For example, in the present embodiment, it is assumed that the data of the write buffer 27 is written to the areas designated by the lowest address to WBset[n] of the memory cell 17.

Internal power-down is executed. At this time, the content of the write buffer 27 is written to the memory cell 17 (S24). Next, restoration occurs from the internal power-down (S25).

An address area corresponding to the area of the write buffer 27, that is, the area from the lowest address to WBset[n] of the memory cell 17, is read (S26). At this time, if data is normally written to the memory cell 17 at the time of internal power-down of S24, all read data must be 1.

The data amount of "1" and the data amount, which is set by the WBset[n], are compared (S27).

If the data amount of "1" and the data amount, which is set by the WBset[n], agree, "1" is stored in the WBthpass[n] (S28). Even in case of power interruption, the data of the amount set by the WBset[n] can be moved to the memory cell 17.

On the other hand, if the data amount of "1" and the data amount, which is set by the WBset[n], do not agree, "0" is stored in the WBthpass[n] (S29). In case of power interruption, the data of the amount set by the WBset[n] cannot be moved to the memory cell 17.

Whether n=7, or not, is determined (S30). In the present embodiment, the training with 8-step thresholds of the write buffer 27 is executed.

When n=7, the data amount indicated by the WBset[n], which corresponds to the greatest value of n of WBthpass=1 (Pass), is set to be the WBth (S32). Alternatively, since the amount of the write buffer 27, which is transferable at a time of power interruption, depends on the capacity of the capacitor, a value, which is less than the data amount indicated by the WBset[n], which corresponds to the greatest value of n of WBthpass=1 (Pass), may be set in consideration of the degradation of the capacitor. Thereby, the buffer threshold (WBth) training is finished (S33).

When n is less than 7, 1 is added to n (S31), the process returns to S22, and the flow of the training is executed once again.

FIG. 10 is a view illustrating a time chart of the host CPU 1, memory controller 4 and memory 5 of the first embodiment.

A write request and write data are sent from the host CPU 1 to the memory controller 4 (T1, T2).

Since the amount of use of the write buffer 27 is less than the threshold (WBth), the write command and write data are sent from the memory controller 4 to the memory 5 (T3, T4). Specifically, when the amount of use of the write buffer 27 of the memory controller 4 is less than the threshold (WBth), the write request is immediately committed. At the same time, the memory controller 4 returns a response of write commit to the host CPU 1 (T5).

A write request and write data are sent from the host CPU 1 to the memory controller 4 (T6, T7). When the amount of use of the write buffer 27 is equal to or more than the threshold (WBth), the memory controller 4 outputs a write command (T8) and writes the write queue log (WR_REQ_Q) 26 to the memory 5 (T9). In the meantime, in the present embodiment, the same threshold (WBth) is used for the threshold (WBth) for executing write commit and the threshold for writing the write queue log (WR_REQ_Q) 26. However, the threshold (WBth) for executing write commit and the threshold (WBth) for writing the write queue log (WR_REQ_Q) 26 may be differently provided.

The memory controller 4 sends write commands and write data to the memory 5 (T10-T13). When the amount of use of the write buffer 27 has become less than the threshold (WBth), the memory controller 4 returns a response of write commit to the host CPU 1 (T14).

According to the write operation of the present embodiment, when the amount of use of the write buffer 27 is less than the threshold (WBth), in order for higher performance, and write commit is returned at the same time as the acceptance of a write request. When the amount of use of the write buffer 27 is equal to or more than the threshold (WBth), it is possible that there is data which cannot be written in case of power interruption. In this case, the current state of the write queue (write queue log (WR_REQ_Q) 26) is made nonvolatile, and write commit is not returned until the amount of use of the write buffer becomes less than the threshold (WBth). Thereby, the write performance is controlled on the condition that no data is lost even in case of power interruption. The meaning of the case where the write queue (write queue log (WR_REQ_Q) 26) is made nonvolatile includes a write request, a write address and a size of the write data in the write queue (write queue log (WR_REQ_Q) 26) are stored in a nonvolatile memory.

In addition, although not illustrated, when the controller dynamically switches a plurality of operation frequencies or operation voltages in accordance with a load by DVFS (Dynamic Voltage Frequency Scaling), there may be a plurality of operational conditions, and the WBth may be set in association with each of the operational conditions.

Besides, when a large capacitor is provided on the outside, it is possible that the charge of the capacitor is not sufficient at a time of activation of the power supply. Thus, during a predetermined time which is necessary for charging, the timing of write commit may be adjusted not to lost any data even in case of power interruption.

3. Second Embodiment

In a second embodiment, it is assumed that the new write operation is always used. As the new write operation, the status read of operation 1 is used. Prior to overwriting data, a write flag (WFLG) is updated for each page. Then, by reading the write flag (WFLG) as a status, the location of data destruction can be detected when power interruption has occurred during data write.

FIG. 11 is a view illustrating functional blocks of a memory 5 of the second embodiment. The memory cell 17 includes a write flag (WFLG) 51 which indicates that write is being executed with respect to each of pages of the memory cell. A Wstatus controller 52 monitors the state of the write flag (WFLG) 51. A status register 53 is a register for retaining the status (Wstatus) of the write flag (WFLG) 51.

In the second embodiment, the write flag (WFLG) 51 is provided with respect to each of pages of the memory cell 17. By referring to the write flags (WFLG) 51, it is possible to determine which page is being written. As another embodiment, one write flag may be provided not in the memory cell 17, but in the mode register 16 or the like. In addition, the write flag (WFLG) 51 may be provided with respect to each of banks.

FIG. 12 is a flowchart of a write operation of the memory 7 of the second embodiment.

To start with, the memory core controller 13 sets the write flag (WFLG) 51=0 at a time of the beginning of the write operation (S51).

Next, prior to writing data, the write flag (WFLG) 51=1 is set (S52). New data is overwritten to a target address (S53). After writing data, the write flag (WFLG) 51=0 is set (S54). The write operation is finished (S55).

The control of write to the write flag (WFLG) 51 is executed by the memory core controller 13. By the flowchart illustrated in FIG. 12, if power interruption occurs during overwrite of data, the destruction of data can be confirmed by referring to the write flag (WFLG) 51.

FIG. 13 is a flowchart of status read of the memory 7 of the second embodiment. In the case of DRAM protocols, a mode register read command (MRR) is accepted and, after a predetermined latency, a register value (Wstatus) of the status register 53 is returned through a data bus.

As illustrated in the Figure, if a status read command is received, status read is started (S61).

The Wstatus controller 52 reads the write flag (WFLG) 51 of each page, and updates the value (Wstatus) of the status register 53 (S62).

The value (Wstatus) of the status register 53 is output through the data bus (S63), and the status read is finished (S64).

Figure 14:
FIG. 14 is a view illustrating a status register 53 of the memory 7 of the second embodiment.

FIG. 14 is a view illustrating the status register 53 of the memory 7 of the second embodiment. In the second embodiment, the status register 53 is a 16-bit signal, and displays whether there is a page which is being written, with respect to each of banks 0 to 15.

In this embodiment, when the value (Wstatus) of the status register 53 is "0", it is indicated that there is a page which is being written in the corresponding bank. When the value (Wstatus) of the status register 53 is "1", it is indicated that there is no page which is being written in the corresponding bank. In another embodiment, a plurality of page addresses, which are being written, may be stored in the status register 53.

Therefore, according to the present embodiment, even when power interruption occurred, the host CPU 1 can confirm the state of data write to the memory 7, by referring to the status register 53 of the memory 7.

4. Third Embodiment

A third embodiment relates to a situation of use of a new write operation, in which when the data length at a time of write in case B has exceeded a threshold (WBLth), data copy of operation 2 is used as the new write operation. In the meantime, the data length at a time of write is a size of write data requested by one write request received from the host CPU.

FIG. 15 is a view illustrating functional blocks of the memory controller 4 of the third embodiment.

The host I/F controller 31 monitors the data length at a time of write, and executes such control that when the write data length has exceeded the threshold (WBLth), a copy of old data is created before new data is overwritten to the memory 5.

The host I/F controller 31 has the following three registers.

A register 61-1 stores the threshold (WBLth) of the write data length.

A register 61-2 stores a training result (WBLthpass) for checking the threshold (WBLth) of the write data length.

A register 61-3 retains a training condition (WBLset) for checking the threshold (WBLth) of the write data length.

FIG. 16 is a view illustrating functional blocks of a memory 5 of the third embodiment. The memory 5 includes a write copy buffer (WCBUF) for copying write data, in a part of the memory cell 17, or in an area different from the memory cell 17. As illustrated in FIG. 16, the write copy buffer (WCBUF) may be provided for each of banks. In addition, a write copy buffer (WCBUF) 74, which is common to each bank, may be provided. FIG. 17 is a view illustrating an example in which the write copy buffer (WCBUF) 74, which is common to each bank, is provided.

The memory 5 includes the following registers as parts of the mode register 16.

A register 71-1 indicates completion of copy of old data (WCopyEnd).

A register 71-2 indicates completion of overwrite of new data (WEnd).

A register 71-3 retains the threshold (WBLth) of write data length.

By the statuses of the register 71-1 and register 71-2, the states of the data in the memory 5 and the write copy buffer are indicated. FIG. 18 is a view illustrating a truth value table of the value (WCopyEnd) of the register 71-1 and the value (WEnd) of the register 71-2.

As illustrated in the Figure, when the value (WCopyEnd) of the register 71-1 is "0" and the value (WEnd) of the register 71-2 is "0", it is indicated that the write copy buffer (WCBUF) is invalid and old data is stored in the memory cell 17. When the value (WCopyEnd) of the register 71-1 is "1" and the value (WEnd) of the register 71-2 is "0", it is indicated that old data is stored in the write copy buffer (WCBUF) and old data is stored in the memory cell 17. When the value (WCopyEnd) of the register 71-1 is "1" and the value (WEnd) of the register 71-2 is "1", it is indicated that old data is stored in the write copy buffer (WCBUF) and new data is stored in the memory cell 17.

After the training was executed, the WBLth is stored in the memory 5 and made nonvolatile. At a time of activation, the memory controller 4 reads the value (WBLth) of the register 71-3 from the memory 5, and stores the value (WBLth) in the register 61-1 of the host I/F controller 31.

FIG. 19 is a flowchart (copy of old data) at a time of write of the memory controller 4 of the third embodiment.

When write is started, the registers 71-1 and 71-2 are set (WCopyEnd=0, WEnd=0) (S71).

When the write data length is less than the threshold (WBLth), a write command is issued to the memory 5, and old data at a target address is overwritten with new data (S72, S78).

When the write data length is equal to or more than the threshold (WBLth), old data in a page of the target address is copied to the write copy buffer (WCBUF) (S73). In this case, after a read command to the target page is issued and old data is read in the memory controller 4, a write command may be issued and the old data may be written to the write copy buffer. In addition, a copy command may be provided, and old data may be written to the write copy buffer from the page within the memory 5, without reading out data to the external bus.

A mode register write command (MRW) is issued to the memory 5, and the register 71-1 is updated (WCopyEnd=1) (S74).

A write command is issued to the memory 5, and the target address is overwritten with new data (S75).

A mode register write command (MRW) is issued to the memory 5, and the register 71-2 is updated (WEnd=1) (S76).

By outputting a response (WR_ACK) to the host CPU 1, write of write data is committed (S77).

In the case of a system which does not include the memory controller in the memory module, the same operation may be executed within the memory. For example, at a time of activation, the training for checking the threshold (WBLth) of the write data length is executed within the memory, and the threshold (WBLth) is stored in the register. In accordance with the write data length from the host, (WCopyEnd) and (WEnd) are automatically updated within the memory.

In FIG. 19, old data is copied to the write copy buffer. However, as illustrated in FIG. 20, new data may be stored in the write copy buffer.

Figure 20:
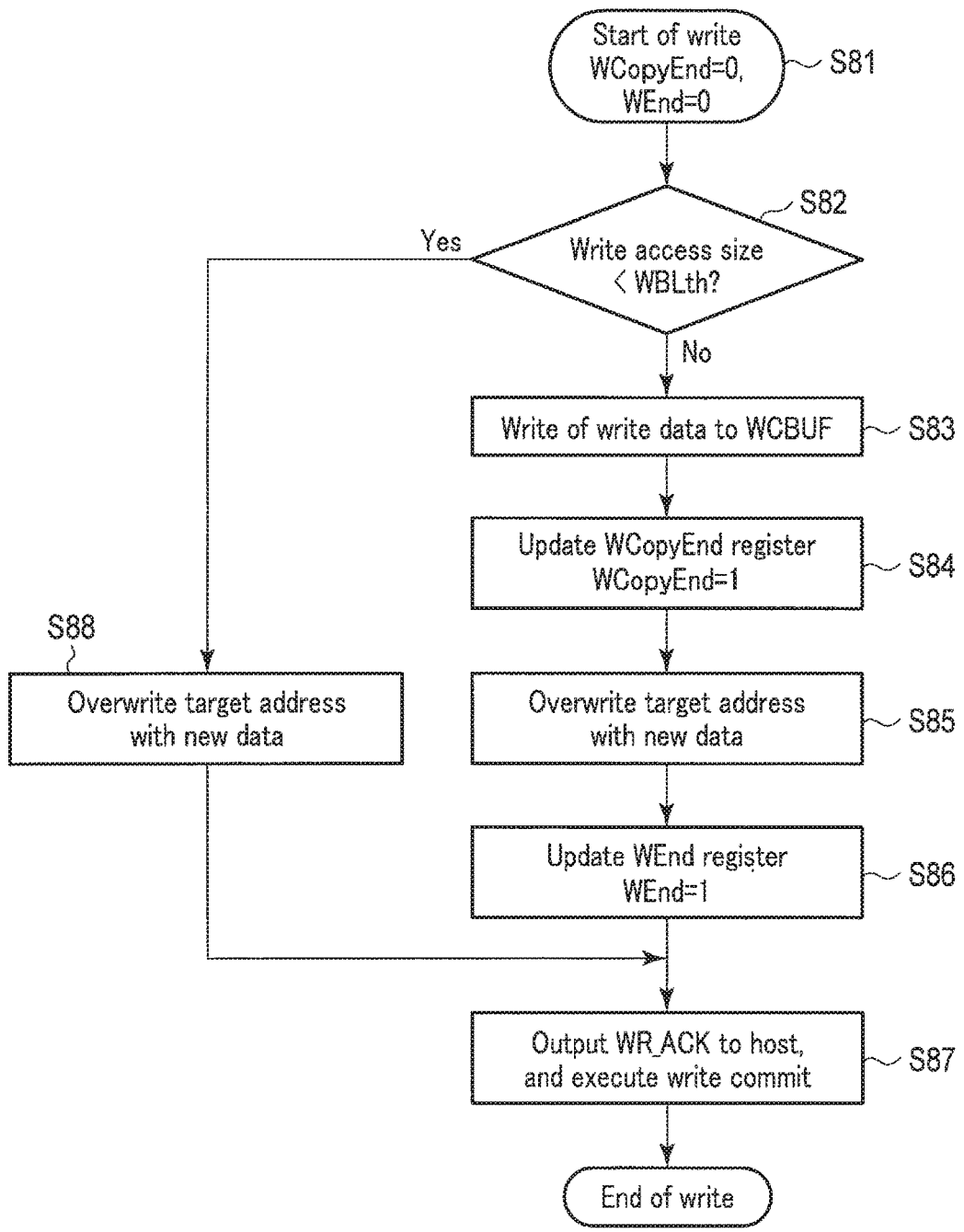
FIG. 20 is a flowchart (copy of new data) of another operation at a time of write of the memory controller 4 of the third embodiment.

FIG. 20 is a flowchart (copy of new data) of another operation at a time of write of the memory controller 4 of the third embodiment.

When write is started, the registers 71-1 and 71-2 are set (WCopyEnd=0, WEnd=0) (S81).

When the write data length is less than the threshold (WBLth), a write command is issued to the memory 5, and old data at a target address is overwritten with new data (S82, S88).

When the write data length is equal to or more than the threshold (WBLth), a write command is issued to the memory 5, and write data is written to the write copy buffer (WCBUF) (S83).

A mode register write command (MRW) is issued to the memory 5, and the register 71-1 is updated (WCopyEnd=1) (S84).

A write command is issued to the memory 5, and the target address is overwritten with new data (S85). At this time, a copy command may be provided instead of issuing the write command, and, without sending write data from the memory controller 4 once again, the data may be sent to the target page from the write copy buffer within the memory 5.

A mode register write command (MRW) is issued to the memory, and the register 71-2 is updated (WEnd=1) (S86).

By outputting a response (WR_ACK) to the host CPU 1, write of write data is committed (S87).

Figure 21:
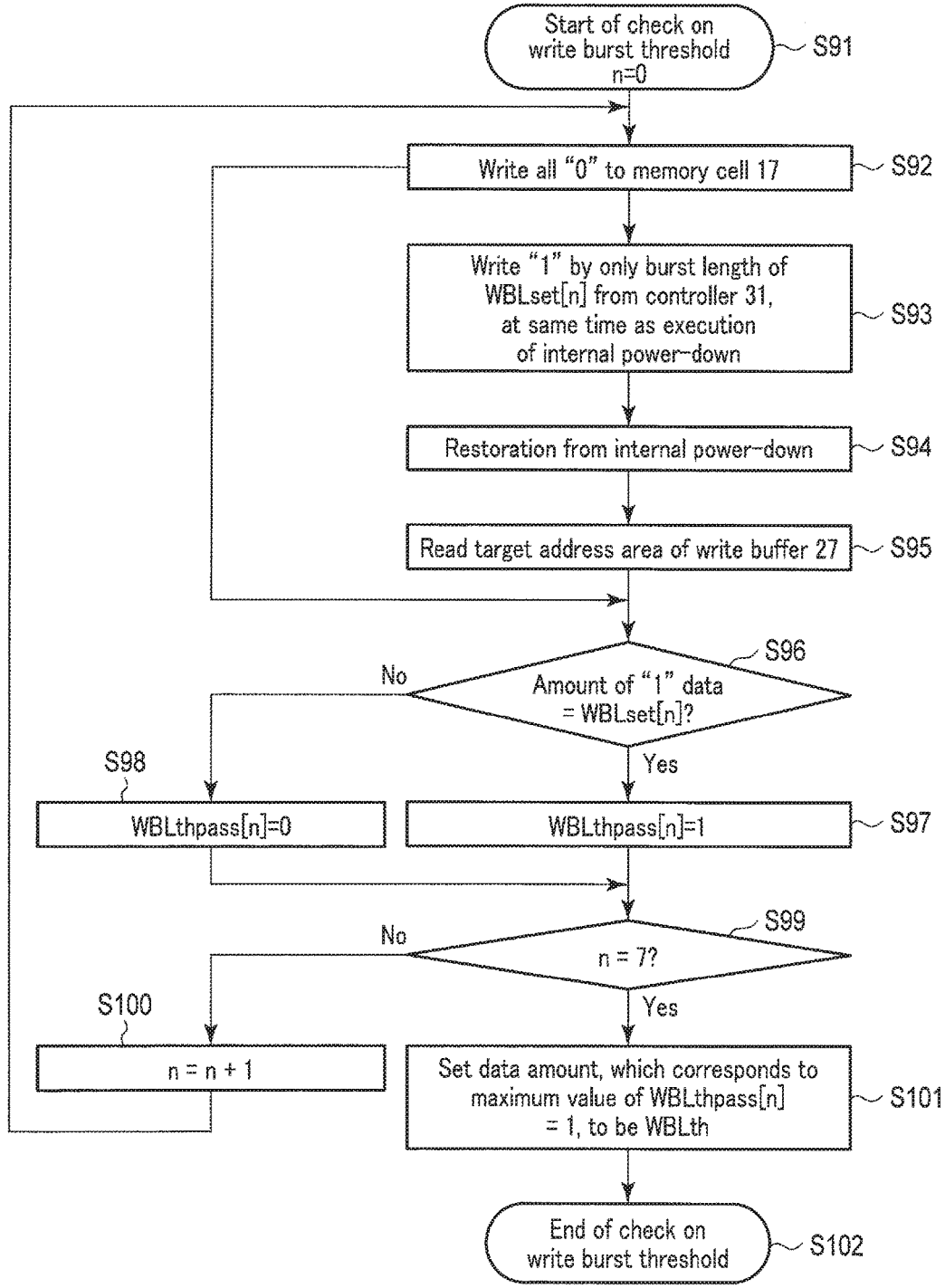
FIG. 21 is a flowchart illustrating training which determines a threshold (WBLth) of a write data length of the third embodiment.

FIG. 21 is a flowchart illustrating training which determines the threshold (WBLth) of the write data length of the third embodiment. FIG. 22 is a view illustrating the register 61-3 which designates a write burst length (WBLset) which is used in the training of write data length. In the present embodiment, the training is executed with 8-step write burst lengths illustrated in FIG. 22.

As illustrated in FIG. 22, the training is executed with eight thresholds, namely WBLset[0]=64 B, WBLset[1]=256 B, WBLset[2]=1 KB, WBLset[3]=4 KB, WBLset[4]=16 KB, WBLset[5]=64 KB, WBLset[6]=256 KB, WBLset[7]= 1 MB (All area).

FIG. 23 is a view illustrating the register 61-2 which stores the result (WBLthpass) of the training of the write burst length. Results (WBLthpass[n]), which are associated with the 8-step training (WBLset[n]) stipulated in the register 61-3, are stored in the register 61-2. For example, in the case of n=0, the training is executed with respect to the write burst length of WBLset[0]=64 B, and the result thereof is stored in the WBLthpass[0]. In the present embodiment, "0" is "Fail", and "1" is "Pass". For example, when a training result as illustrated in FIG. 23 was obtained, the greatest value of the WBthpass=1 (Pass) is n=5. Specifically, WBLth=WBLset[5]=64 KB is selected as the threshold (WBLth) of the write burst. In addition, even when the result as illustrated in FIG. 23 was obtained as described above, a shorter write burst length, for example, WBLth=WBLset [4]=16 KB, may be set, taking it into account that the write burst length, which is transferable at a time of power interruption, decreases due to degradation of capacitors, etc. The timing and condition for executing the training are arbitrary. For example, the training may be executed at each time of activation, or at regular time intervals.

Reference is made back to FIG. 21. A check on the threshold (WBLth) of the write burst is started (S91, n=0).

In all area of the memory cell 17, "0" is written (S92).

A write command is issued to the memory 5 at the same time as the execution of internal power-down, and "1" data is written for only a burst length of WBLset[n] (S93). In the present embodiment, it is assumed that "1" data is written at the lowest address of the memory.

Restoration occurs from the internal power-down (S94).

An address area corresponding to the area of the write buffer 27, that is, the data of the burst length stipulated by the lowest address to the WBLset[n] of the memory, is read (S95). At this time, if data is normally written to the memory at the time of internal power-down in S94, all read data must be 1.

The data amount of "1" and the data amount, which is set by the WBLset[n], are compared (S96).

If the data amount of "1" and the data amount, which is set by the WBLset[n], agree, "1" is stored in the WBLthpass [n] (S97). Even in case of power interruption, the data of the amount set by the WBLset[n] can be moved to the memory 5.

On the other hand, if the data amount of "1" and the data amount, which is set by the WBLset[n], do not agree, "0" is stored in the WBLthpass[n] (S98). In case of power interruption, the data of the amount set by the WBLset[n] cannot be moved to the memory.

Whether n=7, or not, is determined (S99). In the present embodiment, the training with 8-step write data lengths is executed.

When n=7, the data amount indicated by the WBLset[n], which corresponds to the greatest value of n of WBLthpass=1 (Pass), is set to be the WBLth (S101). Alternatively, since the write data length, which is transferable at a time of power interruption, depends on the capacity of the capacitor, a value, which is less than the data amount indicated by the WBLset[n], which corresponds to the greatest value of n of WBLthpass=1 (Pass), may be set in consideration of the degradation of the capacitor. Thereby, the check on the write burst threshold (WBLth) is finished (S102).

When n is less than 7, 1 is added to n (S100), the process returns to S92, and the flow of the training is executed once again.

FIG. 22 is a view illustrating the register 61-3 which designates a write burst length (WBLset) which is used in the training of write data length. In the present embodiment, as illustrated in FIG. 22, the training is executed with 8-step write burst lengths.

FIG. 23 is a view illustrating the register 61-2 which stores the result of the training of the write burst length (WBLthpass). In the present embodiment, results, which are associated with the 8-step training (WBLthpass[n]) stipulated in the register 61-2, are stored in the WBLthpass[n]. For example, in the case of n=0, the training is executed with respect to the write burst length of WBLset[0]=64 B, and the result thereof is stored in the WBLthpass[0]. In the present embodiment, "0" is "Fail", and "1" is "Pass". For example, when a training result as illustrated in FIG. 23 was obtained, the greatest value of the WBthpass=1 (Pass) is n=5. Specifically, WBLth=WBLset[5]=64 KB is selected as the threshold (WBLth) of the write burst. In addition, even when the result as illustrated in FIG. 23 was obtained as described above, a shorter write burst length, for example, WBLth=WBLset[4]=4 KB, may be set, taking it into account that the write burst length, which is transferable at a time of power interruption, decreases due to degradation of capacitors, etc. The timing and condition for executing the training are arbitrary. For example, the training may be executed at each time of activation, or at regular time intervals.

FIG. 24 is a time chart of the host CPU 1, memory controller 4 and memory 5 of the third embodiment. In the time chart below, WBLth=1 KB.

Case in which the write data length is 256 B and is less than the WBLth.

A write request and write data of 256 B are sent from the host CPU 1 to the memory controller 4 (T31, T32).

The memory controller 4 sends a write command and the write data of 256 B to the memory 5 (T33, T34). Specifically, in the case of the write access size 256 B<threshold (WBLth=1 KB), a copy is not created.

The memory controller 4 returns a response of write commit to the host CPU 1 (T35).

Case in which the write data length is 4 KB and is greater than the WBLth.

A write request of 4 KB and write data are sent from the host CPU 1 to the memory controller 4 (T36, T37).

The memory controller 4 issues a copy command (Copy) to the memory 5, and copies data of a target address to the write copy buffer (T38-0~T-38-15, T39-0~T-39-15). In the present embodiment, it is assumed that the page size is 256 B, and copy commands of 256 B×16 are issued in response to the write request of 4 KB.

The memory controller 4 issues a mode register write (MRW) command to the memory 5, and update is executed to (WCopyEnd)=1 (T40, T41).

The memory controller 4 issues a write command (Write) to the memory 5, and overwrites data of a target address (T42-0~T42-15, T43-0~T43-15).

The memory controller 4 issues a mode register write (MRW) command to the memory 5, and update is executed to (WEnd)=1 (T44, T45).

A response (WR_ACK) is output to the host CPU 1, and write of write data is committed (T46).

Specifically, in the case of the write access size 4 KB<threshold (WBLth=1 KB), a data copy prior to update of 4 KB of the target address is first created. Thereafter, new data is overwritten to the target address.

According to the write operation of the present embodiment, when the write burst length is not greater than the threshold (WBLth), write commit is returned at the same time as the acceptance of a write request for higher performance. When the write burst length has become greater than the threshold (WBLth), it is possible that there is data which cannot be written in case of power interruption. Thus, a copy of current write data is created in the write copy buffer (WCBUF0~WCBUFF, or WCBUF 74), and then write data is overwritten. When the write burst length is equal to or more than the threshold (WBLth), even if data is lost in case of power interruption, it is possible to identify which data is valid, based on the contents of (WCopyEnd) and (WEnd). The write data can be recovered by using the data of the target address and the data of the write copy buffer (WCBUF0~WCBUFF, or WCBUF 74).

In addition, although not illustrated, when the controller dynamically switches a plurality of operation frequencies or operation voltages in accordance with performance requirement by DVFS (Dynamic Voltage Frequency Scaling), there may be a plurality of operational conditions, and the WBLth may be set in association with each of the operational conditions.

5. Fourth Embodiment

In a fourth embodiment, a new write operation is executed by making an entry to the new write operation mode of case C.

FIG. 25 is a view illustrating functional blocks of the memory controller 4 of the fourth embodiment.

The host I/F controller 31 uses, as a new write operation, the status register 53 of operation 1. The host I/F controller 31 updates the write flag (WFLG) 51 for each page prior to overwrite, and reads this as a status. Thereby, when power interruption occurred during data write, the location of data destruction can be detected.

FIG. 26 is a view illustrating functional blocks of the memory 5 of the fourth embodiment.

The write flag (WFLG) 51, Wstatus controller 52 and status register 53 are the same as in the second embodiment. The memory 5 includes a register (NWmode) 81 in the mode register 16, which controls the entry to the new write mode.

Figures 27, 28:
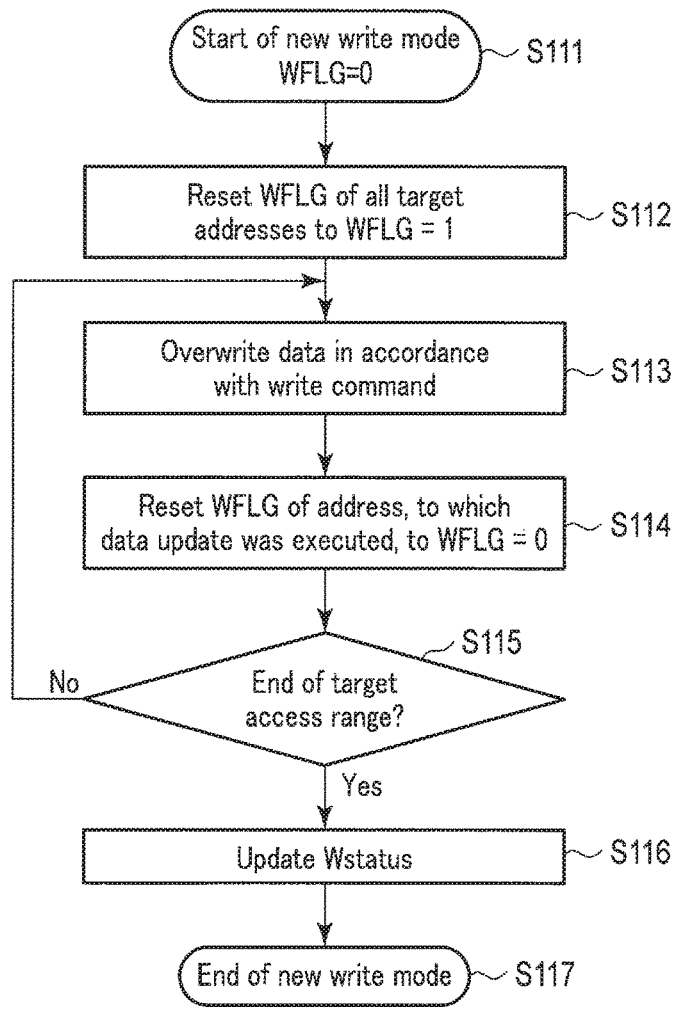
FIG. 27 is a flowchart of a new write mode of the memory of the fourth embodiment.
FIG. 28 is a view illustrating a register (NWmode) 81.

FIG. 27 is a flowchart of the new write mode of the memory of the fourth embodiment.

The memory 5 sets the register (NWmode) 81, thereby making an entry to the new write mode. The register (NWmode) 81 includes information of a start address and an access size.

An entry is made to the new write mode (S111). The default value is WFLG=0.

Setting of "1" is made to the write flag (WFLG) 51 corresponding to the address of an access target (S112). In addition, the data of the address of the access target may be reset to "0" (or "1"). Data is overwritten in accordance with a write command (S113).

The write flag (WFLG) 51 of the address, to which data was updated, is reset to "0" (S114).

It is determined whether the target access range has ended (S115). In S115, if it is determined that the target access range has not ended, the process returns to S113.

On the other hand, in S115, it is determined that the target access range has ended, the status register 53 is updated (S116), and the new write mode is finished (S117).

FIG. 28 is a view illustrating the register (NWmode) 81. The register (NWmode) 81 is a register of 64 bits, and designates a write start address by 55 bits, and a write access size by 9 bits. A plurality of write start addresses and write access sizes may be registered.

FIG. 29 is a time chart of the host CPU 1, memory controller 4 and memory 5 of the fourth embodiment.

Normal write

A write request and write data are sent from the host CPU 1 to the memory controller 4 (T51, T52).

The memory controller 4 sends a write command and the write data to the memory 5 (T53, T54). Specifically, the normal write is immediately committed.

The memory controller 4 returns a response of write commit to the host CPU 1 (T55).

New write mode

The host CPU 1 sends a write request and write data to the memory controller 4 (T56, T57).

The memory controller 4 sends to the memory 5 a start address, which is the target of the new write mode, and an access size, together with a mode register write command (MRW) (T58, T59). For example, the access size is 4 KB.

The memory 5 sets the write flag 51 of the target address (WFLG=1). In addition, the memory controller 4 may reset the target area of 4 KB to "0" data (or "1" data).

The memory controller 4 sends a write command and write data to the memory 5 (T60-0~T60-15, T61-0~T61-15).

Upon writing the write data, the memory 5 resets the write flag 51 of the target (WFLG=0).

Here, upon completing of the access to the target address, the memory 5 updates the status register 53.

The memory controller 4 sends a mode register read command (MRR) to the memory 5 (T62).

The memory 5 returns information of the status register 53 to the controller 4 (T63).

The memory controller 4 recognizes the completion of write by the information of the status register 53, and returns a response of write commit to the host CPU 1 (T64).

Thus, according to the present embodiment, the mode register 16 is provided with the register (NWmode) 81 which controls the entry to the new write mode. In addition, the write flag (WFLG) 51 is updated for each page prior to overwrite. Thereby, when power interruption occurred during data write, the location of data destruction can be detected by reading the write flag (WFLG) 51 as a status.

In the meantime, the fourth embodiment includes the following embodiment:

A memory system including:

a register configured to store a write start address and a write access size;

a memory including write flags which are provided for respective pages and indicate that write is being executed, the memory being capable of overwriting first data to second data at an identical physical address of the memory; and a controller configured to:
set the write flags in a write access range calculated from the write start address and the write access size, when the register is set;
write received data to a received write address of the memory, and reset the write flag corresponding to the received write address, when the write of the received data has ended; and
update a status register which stores states of the write flags, when write of the write access range has ended.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A controller comprising:
a host interface circuit configured to receive a write request to a memory, a write address and data;
a determination circuit configured to determine a write operation in accordance with an amount of use of the data to be written of a write buffer, the write buffer storing the data received by the host interface circuit; and
a change circuit configured to change a notification method to a host in accordance with the write operation determined by the determination circuit,
wherein the changed notification method to the host includes returning a response to the host when the amount of use of the data to be written of the write buffer is less than a threshold, and the controller further comprises a write circuit configured to output the received write request to the memory, the received write address and the received data to the memory, and
wherein the received write request to the memory, the received write address and a size of the received data are stored in a nonvolatile memory when the amount of use of the data to be written of the write buffer is equal to or more than the threshold and an interruption of a power supply to the controller is detected.

2. The controller of claim 1, wherein the threshold is set to be a data amount that the received data in the write buffer is transferable to the memory even when a power supply to the controller is interrupted.

3. The controller of claim 1, wherein the memory is capable of overwriting first data with second data at an identical physical address of the memory.

4. The controller of claim 1, wherein the write circuit is configured to write a predetermined value in a predetermined area of the memory, and
wherein when restoration from power-down of the controller has occurred, the controller is configured to:
read the value of the predetermined area;
detect whether the written value is consistent with the read value or not;
determine the threshold based on a result of the detection where the written value is consistent with the read value.

* * * * *